(12) United States Patent
Iizumi et al.

(10) Patent No.: US 8,951,813 B2
(45) Date of Patent: Feb. 10, 2015

(54) METHOD OF POLISHING A SUBSTRATE HAVING A FILM ON A SURFACE OF THE SUBSTRATE FOR SEMICONDUCTOR MANUFACTURING

(71) Applicant: Ebara Corporation, Tokyo (JP)

(72) Inventors: Takeshi Iizumi, Tokyo (JP); Katsuhide Watanabe, Tokyo (JP); Yoichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 13/938,018

(22) Filed: Jul. 9, 2013

(65) Prior Publication Data
US 2014/0017824 A1 Jan. 16, 2014

(30) Foreign Application Priority Data
Jul. 10, 2012 (JP) ................. 2012-154975

(51) Int. Cl.
| H01L 21/66 | (2006.01) |
| H01L 21/306 | (2006.01) |
| H01L 21/3105 | (2006.01) |
| H01L 21/321 | (2006.01) |
| B24B 37/013 | (2012.01) |
| B24B 37/04 | (2012.01) |
| G01B 7/06 | (2006.01) |
| G01B 11/06 | (2006.01) |
| H01L 21/762 | (2006.01) |

(52) U.S. Cl.
CPC .......... *H01L 21/30625* (2013.01); *H01L 22/12* (2013.01); *H01L 21/31053* (2013.01); *H01L 21/3212* (2013.01); *B24B 37/013* (2013.01); *B24B 37/042* (2013.01); *G01B 7/105* (2013.01); *G01B 11/0625* (2013.01); *G01B 11/0683* (2013.01); *H01L 22/20* (2013.01); *H01L 21/76224* (2013.01)
USPC ............. 438/14; 438/16; 438/17; 451/64

(58) Field of Classification Search
None
See application file for complete search history.

(56) References Cited

U.S. PATENT DOCUMENTS

| 5,492,594 | A | 2/1996 | Burke et al. | |
| 6,447,370 | B1 | 9/2002 | Weldon | |
| 7,118,451 | B2 | 10/2006 | Chen et al. | |
| 7,294,039 | B2 | 11/2007 | Swedek et al. | |
| 2004/0029489 | A1* | 2/2004 | Tsujimura et al. | 451/5 |
| 2006/0194511 | A1* | 8/2006 | Nagayama et al. | 451/5 |
| 2010/0081219 | A1* | 4/2010 | Tanaka et al. | 438/17 |
| 2010/0151770 | A1 | 6/2010 | Nakao et al. | |
| 2011/0300776 | A1 | 12/2011 | Mai et al. | |
| 2014/0141694 | A1 | 5/2014 | Zhang et al. | |

FOREIGN PATENT DOCUMENTS

| JP | 08-099264 | 4/1996 |
| JP | 09-109023 | 4/1997 |
| JP | 2004-12302 | 1/2004 |

* cited by examiner

*Primary Examiner* — Julio J Maldonado
*Assistant Examiner* — Robert Bachner
(74) *Attorney, Agent, or Firm* — Baker & Hostetler LLP

(57) ABSTRACT

A method of polishing a substrate having a film is provided. The method includes: performing polishing of the substrate in a polishing section; transporting the polished substrate to a wet-type film thickness measuring device prior to cleaning and drying of the substrate; measuring a thickness of the film by the wet-type film thickness measuring device; comparing the thickness with a predetermined target value; and if the thickness has not reached the predetermined target value, performing re-polishing of the substrate in the polishing section prior to cleaning and drying of the substrate.

20 Claims, 34 Drawing Sheets

POLISH COPPER FILM 107

REMOVE COPPER FILM 107

REMOVE BARRIER FILM 105
+
REMOVE SECOND HARD
MASK FILM 104

REMOVE FIRST HARD
MASK FILM 102
+
POLISH INTERLAYER
DIELECTRIC FILM 101

POLISH COPPER FILM 107

REMOVE COPPER FILM 107

REMOVE BARRIER FILM 105
+
REMOVE SECOND HARD
MASK FILM 104
+
POLISH FIRST HARD
MASK FILM 102

REMOVE FIRST HARD
MASK FILM 102
+
POLISH INTERLAYER
DIELECTRIC FILM 101

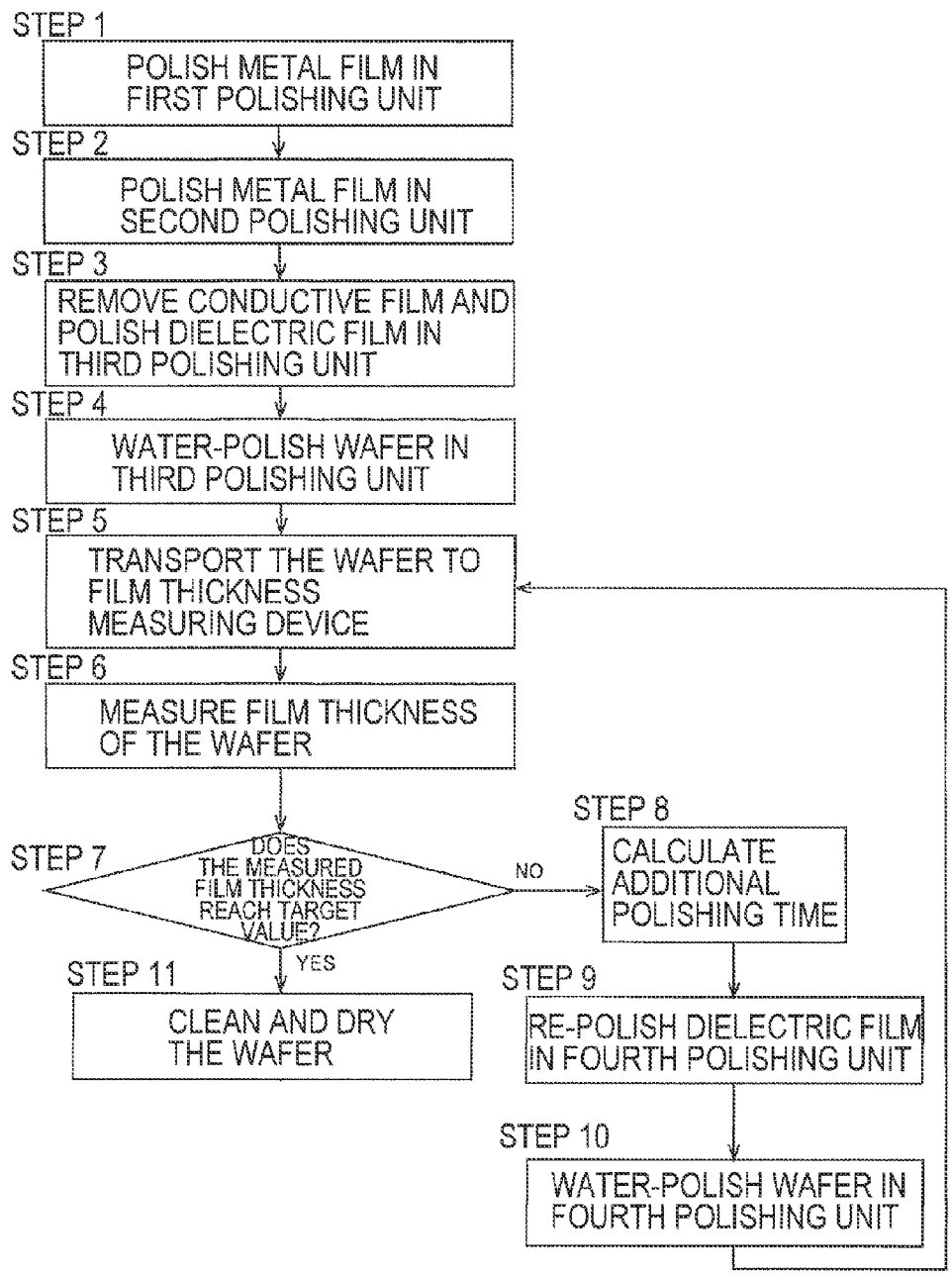

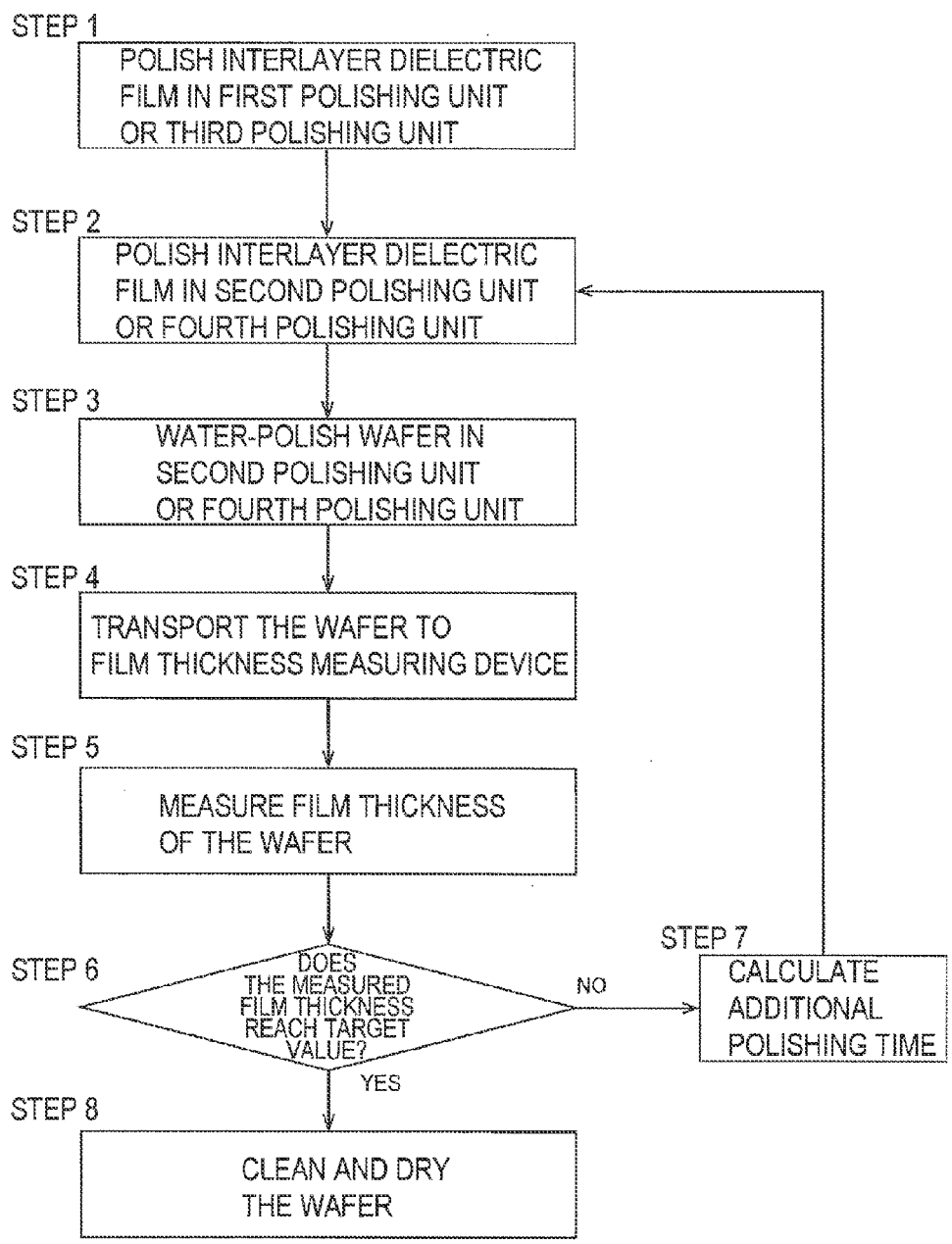

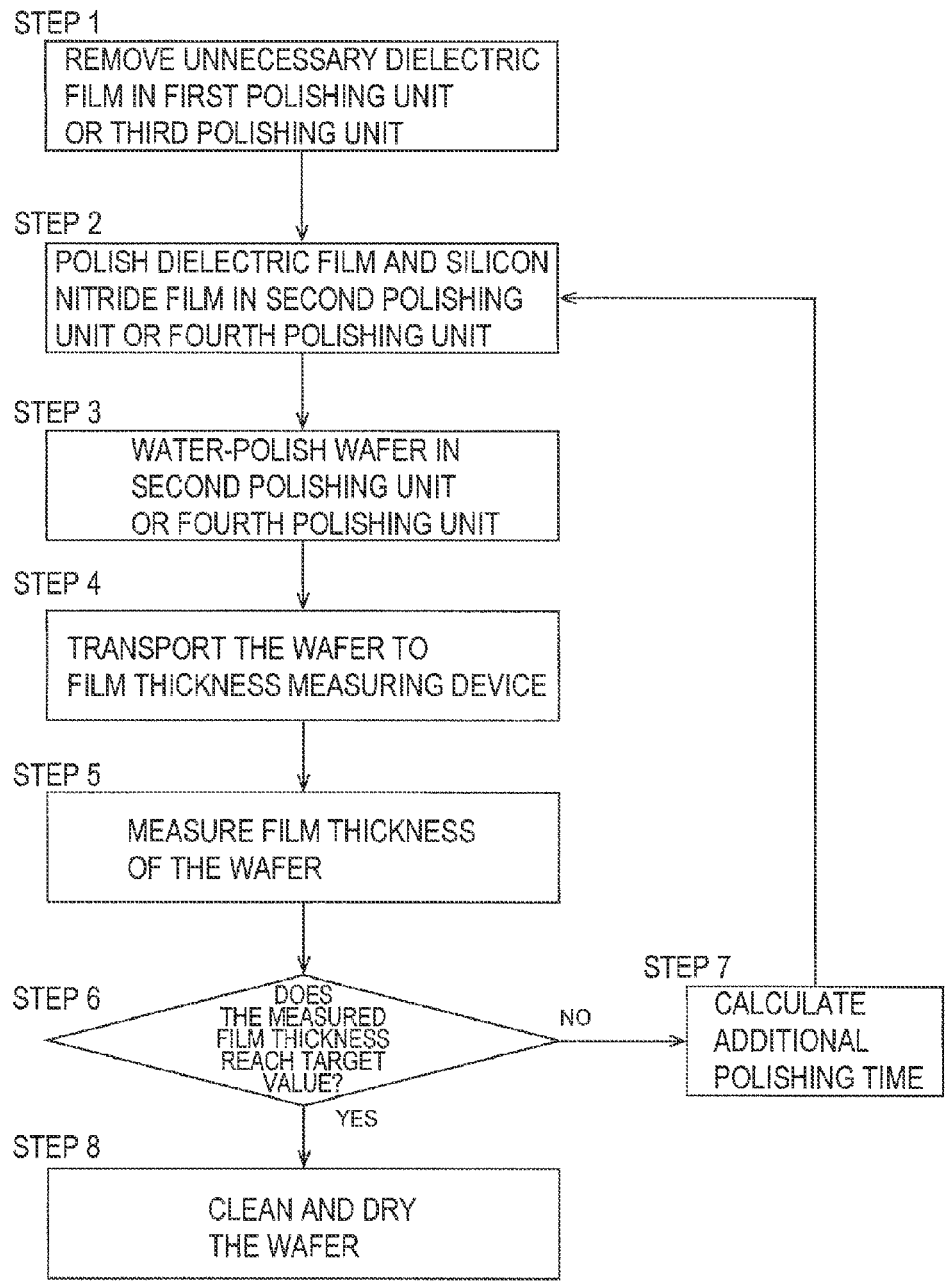

METHOD OF POLISHING A SUBSTRATE HAVING A FILM ON A SURFACE OF THE SUBSTRATE FOR SEMICONDUCTOR MANUFACTURING

CROSS REFERENCE TO RELATED APPLICATION

This document claims priority to Japanese Patent Application No. 2012-154975, filed Jul. 10, 2012, the entire contents of which are hereby incorporated by reference.

BACKGROUND OF THE INVENTION

1. Field of the Invention

The present invention relates to a method of polishing a substrate, such as a wafer, and more particularly to a polishing method including the steps of measuring a film thickness of the substrate after polishing it and re-polishing the substrate if the film thickness has not reached a target value.

2. Description of the Related Art

Semiconductor devices are expected to become finer and finer in the future. In order to realize such a fine structure, a polishing apparatus, which is typified by a CMP apparatus, is required to have a more precise processing controllability and a high polishing performance. Specifically, a more accurate remaining film control (i.e., more accurate detection of a polishing end point) and improved polishing results (i.e., less defects and high planarity of polished surface) are required. In addition, a higher productivity (i.e., throughput) is also required.

In the present polishing apparatus, so-called "rework", which is re-polishing of the wafer, may be performed in order to improve the polishing accuracy. This re-polishing includes the steps of transporting the wafer, which has been polished in the polishing apparatus, to an external film thickness measuring device, measuring a film thickness of the polished wafer by the film thickness measuring device, and polishing the wafer again in order to eliminate a difference between the measured film thickness and a target film thickness.

Flow of a conventional wafer polishing method will be described with reference to FIG. 1. The polishing apparatus is typically partitioned into a polishing section and a cleaning section. A wafer is firstly transported into the polishing section, where the wafer is placed in sliding contact with a polishing pad on a polishing table, while a polishing liquid (slurry) is supplied onto the polishing pad. The wafer is polished in the presence of the polishing liquid (step 1). The polished wafer is then transported to the cleaning section, where the wafer is cleaned (step 2) and further the cleaned wafer is dried (step 3).

The wafer that has been processed in this manner is then transported to a film thickness measuring device provided exterior of the polishing apparatus (step 4), and a film thickness of the polished wafer is measured by the film thickness measuring device (step 5). The film thickness of the wafer is compared with a predetermined target film thickness (step 6), and if the film thickness of the wafer has not reached the target film thickness, then the wafer is transported into the polishing apparatus again, where the wafer is re-polished, cleaned, and dried. Such re-polishing (which is so-called rework) is effective at realizing an accurate film thickness, but on the other hand it takes a certain time from the first polishing step to the re-polishing step, lowering the productivity (throughput).

According the above described polishing method, it is possible to adjust polishing conditions (such as a polishing time and a polishing pressure) for subsequent wafers based on the film thickness measurement result in the external film thickness measuring device. However, when the adjusted polishing conditions are applied to the wafer polishing process, several wafers have already been polished. This means that the adjusted polishing conditions are not reflected in polishing of those wafers. In order to reflect the adjusted polishing conditions in polishing of the next wafer, it is necessary to keep the next wafer waiting until the film thickness measurement of a preceding wafer is terminated and the adjustment of the polishing conditions is completed. However, such an operation results in a lowered productivity (throughput).

SUMMARY OF THE INVENTION

The present invention has been made in view of the above circumstances. It is therefore an object of the present invention to provide a polishing method capable of reducing a time required for re-polishing of a substrate, such as a wafer, or eliminating re-polishing of the substrate itself, and capable of applying adjusted polishing conditions to polishing of the next substrate immediately.

In a first embodiment, a method of polishing a substrate having a film is provided. The method comprises: performing polishing of the substrate in a polishing section; transporting the polished substrate to a wet-type film thickness measuring device prior to cleaning and drying of the substrate; measuring a thickness of the film by the wet-type film thickness measuring device; comparing the thickness with a predetermined target value; and if the thickness has not reached the predetermined target value, performing re-polishing of the substrate in the polishing section prior to cleaning and drying of the substrate.

In a second embodiment, a method of polishing a substrate having a film is provided. The method comprises: polishing the substrate while measuring a thickness of the film with a film thickness sensor; terminating polishing of the substrate when a measured value of the thickness of the film, obtained from the film thickness sensor, reaches a predetermined value; transporting the polished substrate to a wet-type film thickness measuring device; measuring a thickness of the film by the wet-type film thickness measuring device; calibrating the film thickness sensor based on the measured value of the thickness of the film obtained from the film thickness sensor and a measured value of the thickness of the film obtained from the wet-type film thickness measuring device; polishing a subsequent substrate while measuring a thickness of a film of the subsequent substrate with the calibrated film thickness sensor; and terminating polishing of the subsequent substrate when the thickness of the film reaches a predetermined target value.

In a third embodiment, a method of polishing a substrate having a film is provided. The method comprises: performing polishing of the substrate in a polishing section; transporting the polished substrate, with its surface wet, to a wet-type film thickness measuring device; measuring a thickness of the film by the wet-type film thickness measuring device; comparing the thickness with a predetermined target value; and if the thickness has not reached the predetermined target value, performing re-polishing of the substrate in the polishing section prior to cleaning and drying of the substrate.

FIG. 2 is a flowchart showing a polishing method according to the first embodiment and the third embodiment described above. As shown in FIG. 2, before a polished substrate (e.g., wafer) is cleaned and dried, a film thickness of the wafer in a wet state is measured. If the measured film thickness has not reached the target value, then the substrate is returned to the polishing section, where the substrate is re-polished. Since the substrate is re-polished prior to cleaning and drying of the substrate, a time required for re-polishing the substrate can be shortened. As a result, a throughput can be improved. Moreover, polishing conditions (e.g., polishing time and polishing pressure) adjusted based on the film-thickness measurement result can be readily applied to polishing of the next substrate. Therefore, the throughput can be improved.

According to the above-described second embodiment, the film thickness sensor is calibrated using the measured values of the film thickness obtained by the wet-type film thickness measuring device which can achieve highly accurate measurement. Therefore, an accuracy of in-situ film thickness measurement that is performed during polishing of subsequent substrates can be improved. As a result, re-polishing of the substrate can be eliminated. Moreover, the polishing conditions (e.g., polishing time and polishing pressure) adjusted based on the film-thickness measurement result can be applied to polishing of the next substrate. Therefore, the throughput can be improved.

BRIEF DESCRIPTION OF THE DRAWINGS

FIG. 13 is a flowchart for illustrating the polishing method shown in FIG. 12A through FIG. 12D;

FIG. 19 is a flowchart for illustrating the polishing method shown in FIG. 18A and FIG. 18B;

FIG. 22 is a flowchart for illustrating the polishing method shown in FIG. 21A and FIG. 21B;

DETAILED DESCRIPTION

Embodiments will be described with reference to the drawings.

Figure 1:
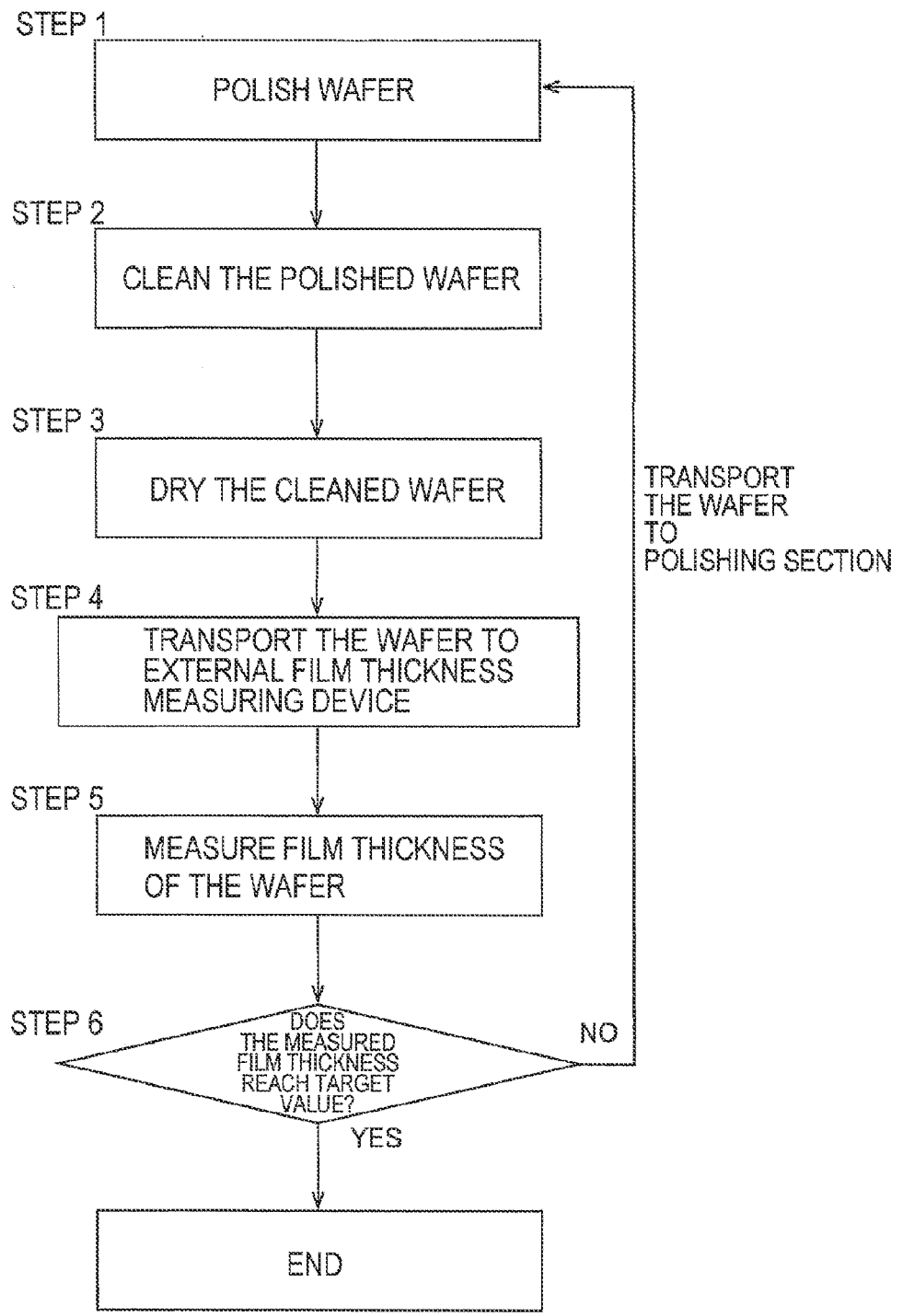
FIG. 1 is a flowchart illustrating a conventional wafer polishing method.
Figure 2:
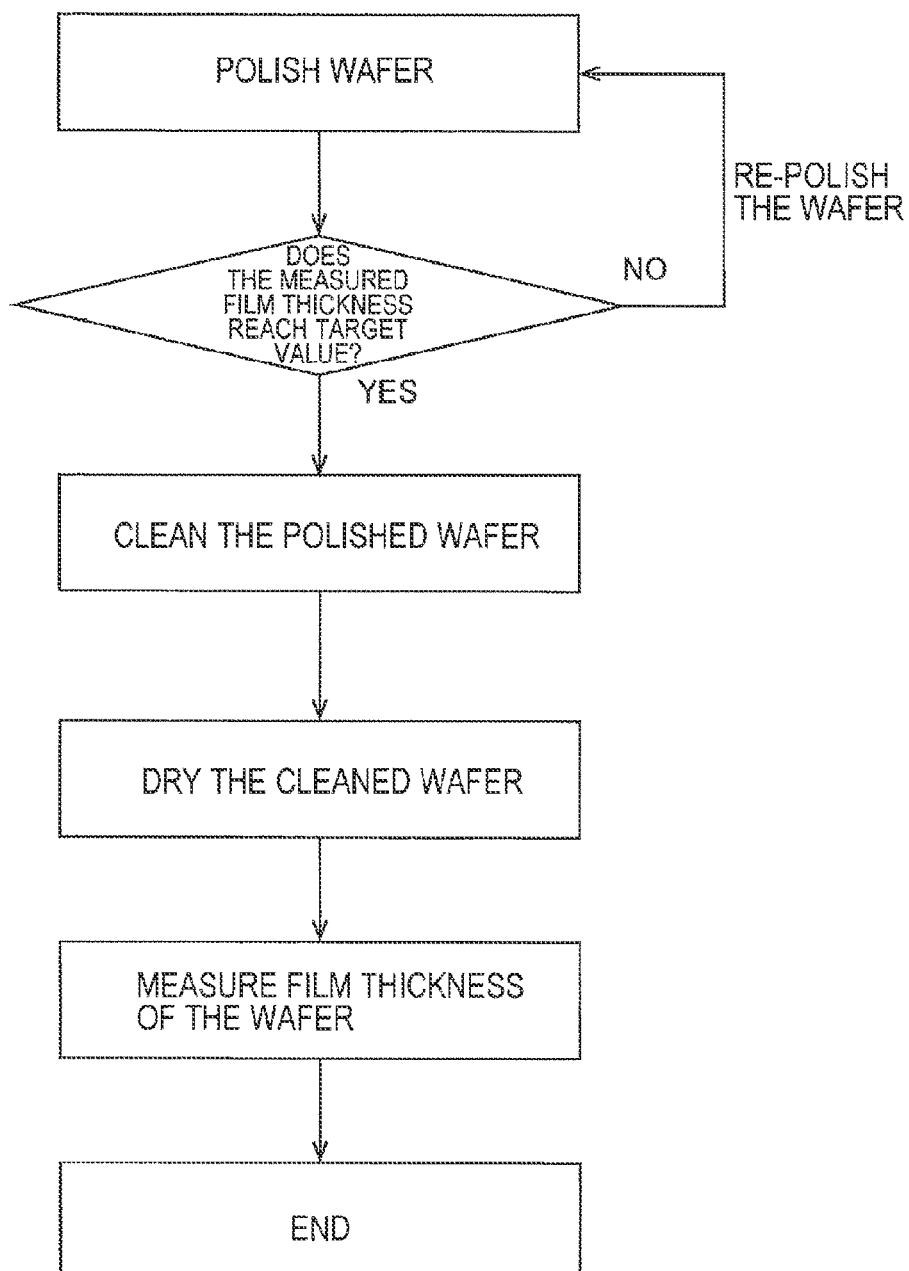
FIG. 2 is a flowchart illustrating an embodiment of a polishing method.
Figure 3:
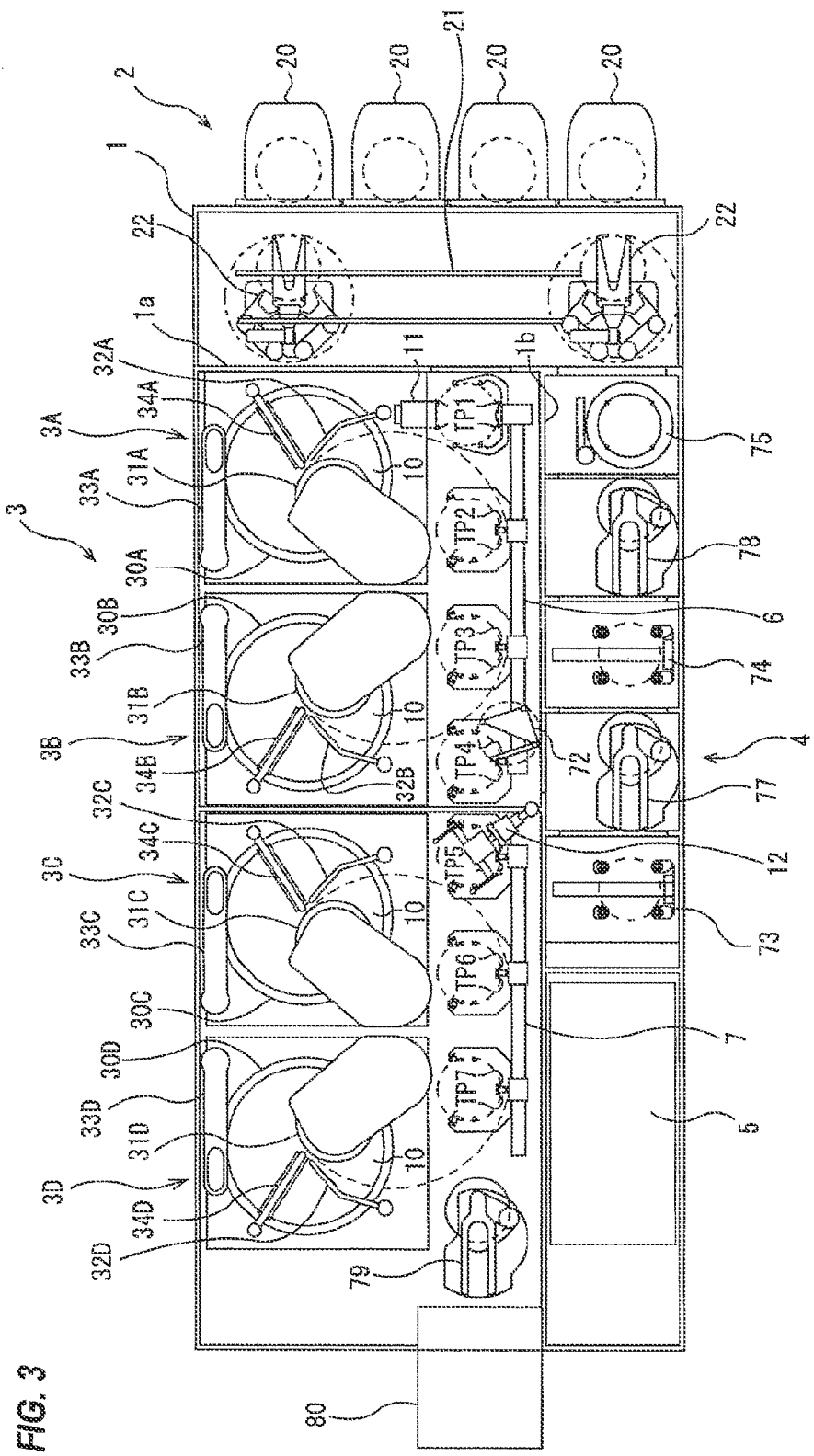
FIG. 3 is a view showing a polishing apparatus which can perform the embodiment of the polishing method.

FIG. 3 is a view showing a polishing apparatus capable of performing an embodiment of a polishing method. As shown in FIG. 3, the polishing apparatus has a housing 1 in a rectangular shape. An interior space of the housing 1 is divided by partitions 1a and 1b into a load-unload section 2, a polishing section 3, and a cleaning section 4. The polishing apparatus includes an operation controller 5 configured to control wafer processing operations.

The load-unload section 2 has front load sections 20 on which wafer cassettes are placed, respectively. A plurality of wafers (substrates) are stored in each wafer cassette. The load-unload section 2 has a moving mechanism 21 extending along an arrangement direction of the front load sections 20. Two transfer robots (loaders) 22 are provided on the moving mechanism 21, so that the transfer robots 22 can move along the arrangement direction of the front load sections 20. Each transfer robot 22 is able to access the wafer cassettes mounted to the front load sections 20.

The polishing section 3 is an area where a wafer (i.e., a substrate) is polished. This polishing section 3 includes a first polishing unit 3A, a second polishing unit 3B, a third polishing unit 3C, and a fourth polishing unit 3D. As shown in FIG. 3, the first polishing unit 3A includes a first polishing table 30A supporting a polishing pad 10 having a polishing surface, a first top ring 31A for holding a wafer and pressing the wafer against the polishing pad 10 on the polishing table 30A so as to polish the wafer, a first polishing liquid supply mechanism 32A for supplying a polishing liquid (e.g., slurry) and a dressing liquid (e.g., pure water) onto the polishing pad 10, a first dresser 33A for dressing the polishing surface of the polishing pad 10, and a first atomizer 34A for ejecting a liquid (e.g., pure water) or a mixture of a liquid (e.g., pure water) and a gas (e.g., nitrogen gas) in an atomized state onto the polishing surface of the polishing pad 10.

Similarly, the second polishing unit 3B includes a second polishing table 30B supporting a polishing pad 10, a second top ring 31B, a second polishing liquid supply mechanism 32B, a second dresser 33B, and a second atomizer 34B. The third polishing unit 3C includes a third polishing table 30C supporting a polishing pad 10, a third top ring 31C, a third polishing liquid supply mechanism 32C, a third dresser 33C, and a third atomizer 34C. The fourth polishing unit 3D includes a fourth polishing table 30D supporting a polishing pad 10, a fourth top ring 31D, a fourth polishing liquid supply mechanism 32D, a fourth dresser 33D, and a fourth atomizer 34D.

Figure 4:
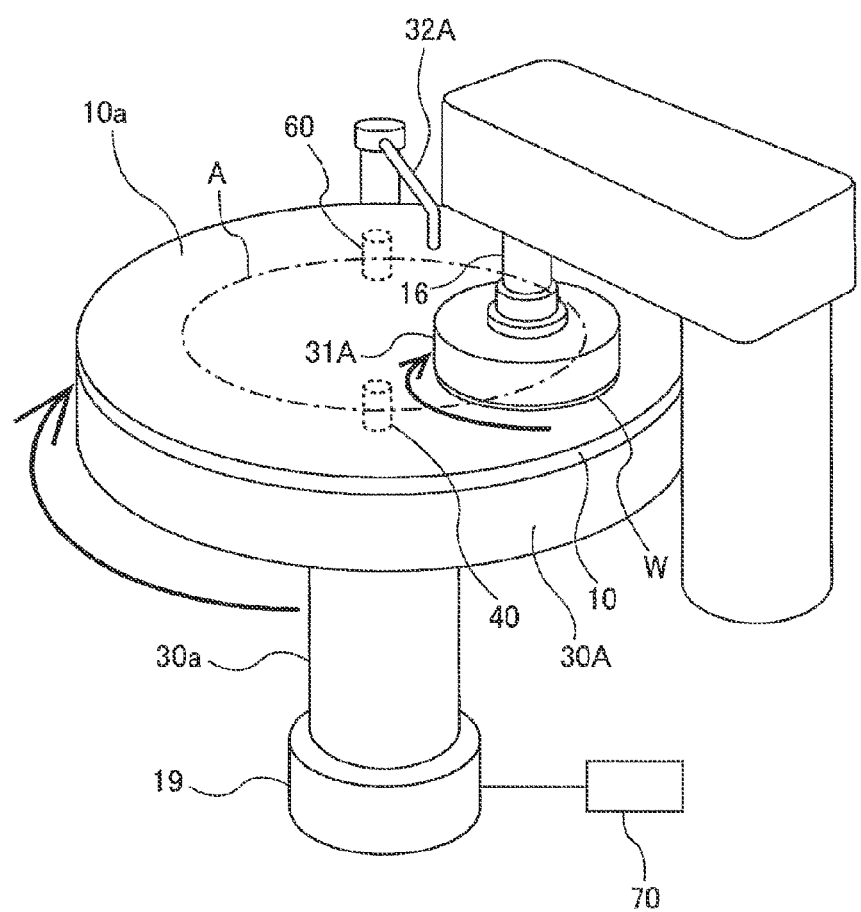
FIG. 4 is a perspective view schematically showing a first polishing unit.

The first polishing unit 3A, the second polishing unit 3B, the third polishing unit 3C, and the fourth polishing unit 3D have the same configuration. Therefore, the first polishing unit 3A will be described below with reference to FIG. 4. FIG. 4 is a perspective view schematically showing the first polishing unit 3A. In FIG. 4, the dresser 33A and the atomizer 34A are omitted.

The polishing table 30A is coupled to a table motor 19 through a table shaft 30a, so that the polishing table 30A is rotated by the table motor 19 in a direction indicated by arrow. The table motor 19 is located below the polishing table 30A. The polishing pad 10 is attached to an upper surface of the polishing table 30A. The polishing pad 10 has an upper surface 10a, which provides a polishing surface for polishing the wafer W. The top ring 31A is secured to a lower end of the top ring shaft 16. The top ring 31A is configured to hold the wafer W on its lower surface by vacuum suction. The top ring shaft 16 is elevated and lowered by an elevating mechanism (not shown in the drawing).

An optical film thickness sensor 40 and an eddy current film thickness sensor 60 each for obtaining film thickness signal that varies in accordance with a film thickness of the wafer W are arranged in the polishing table 30A. These film thickness sensors 40 and 60 are rotated in unison with the polishing table 30A as illustrated by arrow A and obtain the film thickness signals of the wafer W held by the top ring 31A. The optical film thickness sensor 40 and the eddy current film thickness sensor 60 are coupled to the operation controller 5 shown in FIG. 3 so that the film thickness signals obtained by these film thickness sensors 40 and 60 are transmitted to the operation controller 5. The operation controller 5 is configured to produce from the film thickness signal a film thickness index value that directly or indirectly indicates the film thickness.

Further, a torque current measuring device 70 is provided for measuring an input current (i.e., a torque current) of the table motor 19 that rotates the polishing table 30A. A torque current value measured by the torque current measuring device 70 is sent to the operation controller 5, which monitors the torque current value during polishing of the wafer W.

The wafer W is polished as follows. The top ring 31A and the polishing table 30A are rotated in directions as indicated by arrows, while the polishing liquid (i.e., the slurry) is supplied onto the polishing pad 10 from the polishing liquid supply mechanism 32A. In this state, the top ring 31A, holding the wafer W on its lower surface, is lowered by the top ring shaft 16 and presses the wafer W against the polishing surface 10a of the polishing pad 10. The surface of the wafer W is polished by a mechanical action of abrasive grains contained in the polishing liquid and a chemical action of the polishing liquid. After polishing of the wafer W, dressing (or conditioning) of the polishing surface 10a is performed by the dresser 33A. Further, high-pressure fluid is supplied from the atomizer 34A onto the polishing surface 10a to remove polishing debris and the abrasive grains from the polishing surface 10a.

Figure 5:
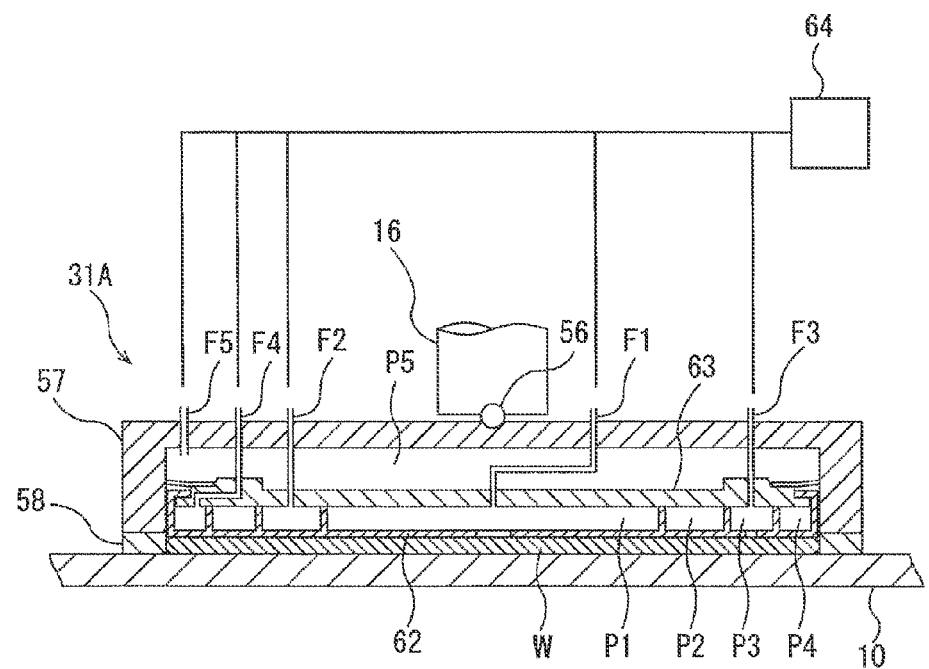
FIG. 5 is a cross-sectional view of a top ring shown in FIG. 4.

The top ring 31A is configured to be capable of pressing a plurality of zones of the wafer separately against the polishing pad 10. FIG. 5 is a cross-sectional view of the top ring 31A shown in FIG. 4. The top ring 31A has a top ring body 57 coupled to the top ring shaft 16 via a universal joint 56, and a retaining ring 58 provided on a lower portion of the top ring body 57.

The top ring 31A further has a flexible membrane 62 to be brought into contact with the wafer W, and a chucking plate 63 that holds the membrane 62. The membrane 62 and the chucking plate 63 are disposed below the top ring body 57. Four pressure chambers (air bags) P1, P2, P3, and P4 are provided between the membrane 62 and the chucking plate 63. The pressure chambers P1, P2, P3, and P4 are formed by the membrane 62 and the chucking plate 63. The central pressure chamber P1 has a circular shape, and the other pressure chambers P2, P3, and P4 have an annular shape. These pressure chambers P1, P2, P3, and P4 are in a concentric arrangement.

Pressurized fluid (e.g., pressurized air) is supplied into the pressure chambers P1, P2, P3, and P4 or vacuum is developed in the pressure chambers P1, P2, P3, and P4 by a pressure regulator 64 through fluid passages F1, F2, F3, and F4, respectively. The pressures in the pressure chambers P1, P2, P3, and P4 can be changed independently to thereby independently adjust loads on four zones of the wafer W: a central portion; an inner intermediate portion; an outer intermediate portion; and a peripheral portion. Further, by elevating or lowering the top ring 31A in its entirety, the retaining ring 58 can press the polishing pad 10 at a predetermined load.

A pressure chamber P5 is formed between the chucking plate 63 and the top ring body 57. Pressurized fluid is supplied into the pressure chamber P5 or vacuum is developed in the pressure chamber P5 by the pressure regulator 64 through a fluid passage F5. With these operations, the chucking plate 63 and the membrane 62 in their entirety can move up and down. The retaining ring 58 is arranged around the wafer W so as to prevent the wafer W from coming off the top ring 31A during polishing. The membrane 62 has an opening in a portion that forms the pressure chamber P3, so that the wafer W can be held by the top ring 31A via the vacuum suction by producing vacuum in the pressure chamber P3. Further, the wafer W can be released from the top ring 31A by supplying nitrogen gas or clean air into the pressure chamber P3.

The operation controller 5 is configured to determine target values of internal pressure of the pressure chambers P1, P2, P3, and P4 based on the film thickness index values in the zones on the wafer surface corresponding to the pressure chambers P1, P2, P3, and P4. The operation controller 5 sends command signals of the target values of internal pressure to the pressure regulator 64 so as to control the pressure regulator 64 such that the internal pressures of the pressure chambers P1, P2, P3, and P4 accord with the target values. In this manner, the top ring 31A having the multiple pressure chambers can press the respective zones on the wafer surface separately in accordance with the polishing progress, and can therefore polish the film uniformly.

Referring back to FIG. 3, a first linear transporter 6 is arranged adjacent to the first polishing unit 3A and the second polishing unit 3B. This first linear transporter 6 is configured to transport the wafer between four transfer positions (i.e., a first transfer position TP1, a second transfer position TP2, a third transfer position TP3, and a fourth transfer position TP4). A second linear transporter 7 is arranged adjacent to the third polishing unit 3C and the fourth polishing unit 3D. This second linear transporter 7 is configured to transport the wafer between three transfer positions (i.e., a fifth transfer position TP5, a sixth transfer position TP6, and a seventh transfer position TP7).

The wafer is transported to the first polishing unit 3A and the second polishing unit 3B by the first linear transporter 6. The top ring 31A of the first polishing unit 3A is moved between a position above the polishing table 30A and the second transfer position TP2 by the swinging motion of the top ring 31A. Therefore, the wafer is transferred to and from the top ring 31A at the second transfer position TP2. Similarly, the top ring 31B of the second polishing unit 3B is moved between a position above the polishing table 30B and the third transfer position TP3, and the wafer is transferred to and from the top ring 31B at the third transfer position TP3. The top ring 31C of the third polishing unit 3C is moved between a position above the polishing table 30C and the sixth transfer position TP6, and the wafer is transferred to and from the top ring 31C at the sixth transfer position TP6. The top ring 31D of the fourth polishing unit 3D is moved between a position above the polishing table 30D and the seventh transfer position TP7, and the wafer is transferred to and from the top ring 31D at the seventh transfer position TP7.

A lifter 11 for receiving the wafer from the transfer robot 22 is provided adjacent to the first transfer position TP1. The wafer is transported from the transfer robot 22 to the first linear transporter 6 via the lifter 11. A shutter (not shown in the drawing) is provided on the partition 1a at a position between the lifter 11 and the transfer robot 22. When the wafer is to be transported, this shutter is opened to allow the transfer robot 22 to deliver the wafer to the lifter 11.

A swing transporter 12 is provided between the first linear transporter 6, the second linear transporter 7, and the cleaning section 4. Transporting of the wafer from the first linear transporter 6 to the second linear transporter 7 is performed by the swing transporter 12. The wafer is transported to the third polishing unit 3C and/or the fourth polishing unit 3D by the second linear transporter 7.

A wet-type film thickness measuring device 80 is provided between the polishing section 3 and the cleaning section 4. More specifically, the wet-type film thickness measuring device 80 is located adjacent to the fourth polishing unit 3D of the polishing section 3. A transfer robot 79 is provided between the second linear transporter 7 and the wet-type film thickness measuring device 80. The wafer that has been polished in the polishing section 3 is transported from the second linear transporter 7 to the wet-type film thickness measuring device 80 by the transfer robot 79. Therefore, the wafer is transported between the polishing section 3 and the wet-type film thickness measuring device 80 by a transporting device which is constituted by the second linear transporter 7 and the transfer robot 79. The transfer robot 79 may be omitted so that the wafer is transported to the wet-type film thickness measuring device 80 directly by the second linear transporter 7. In this case, the wafer is transported between the polishing section 3 and the wet-type film thickness measuring device 80 by a transporting device which is constituted by the second linear transporter 7.

Figure 6A:
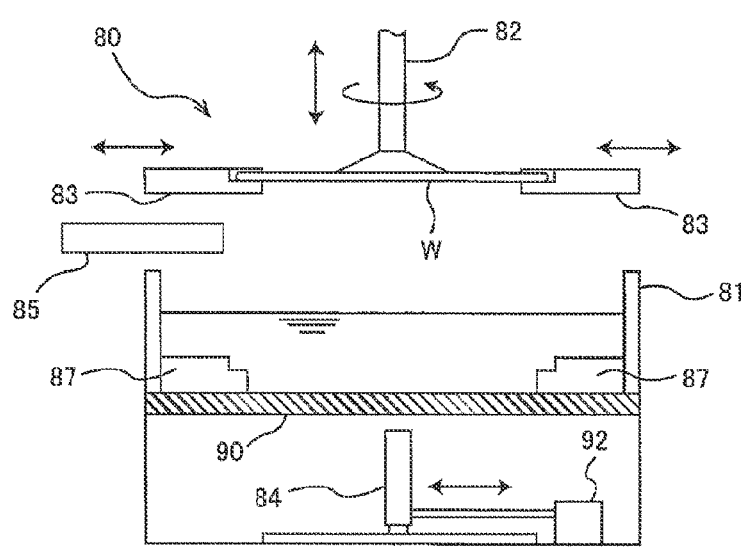
FIGS. 6A and 6B are schematic views of a wet-type film thickness measuring device.

The wet-type film thickness measuring device 80 is a wet-type optical film thickness measuring device capable of measuring a film thickness of a wet wafer prior to a drying process. This wet-type film thickness measuring device 80 is configured to measure a thickness of an optically transparent film formed on the wafer with a liquid (typically pure water) existing between the wafer and an optical film thickness measuring head. The liquid, whose physical property is known, is present with a predetermined thickness between the wafer and the film thickness measuring head. The wet-type film thickness measuring device 80 will be described with reference to FIG. 6A and FIG. 6B each showing a schematic view of the wet-type film thickness measuring device 80. The wet-type film thickness measuring device 80 includes a water reservoir 81 in which pure water is stored, a holding device 82 configured to hold the wafer W via vacuum suction, and an optical film thickness measuring head 84 configured to measure the film thickness of the wafer W.

The wafer W is placed onto support arms 83 by the above-described transfer robot 79. The wafer W on the support arms 83 is held by the holding device 82, and then the support arms 83 move in a direction away from the wafer W. The holding device 82 is configured to rotate the wafer W about its center and is further configured to move the wafer W in a vertical direction. An orientation detector 85 for detecting an orientation of the wafer W in a circumferential direction thereof is provided above the water reservoir 81. This orientation detector 85 is configured to detect the orientation of the wafer W by detecting a cutout portion, which is called a notch or an orientation flat, formed on a periphery of the wafer W. While the wafer W is rotated by the holding device 82, the orientation detector 85 detects the orientation of the wafer W. The wafer W is further rotated by the holding device 82 until the wafer W is oriented to a predetermined direction.

Figure 6B:
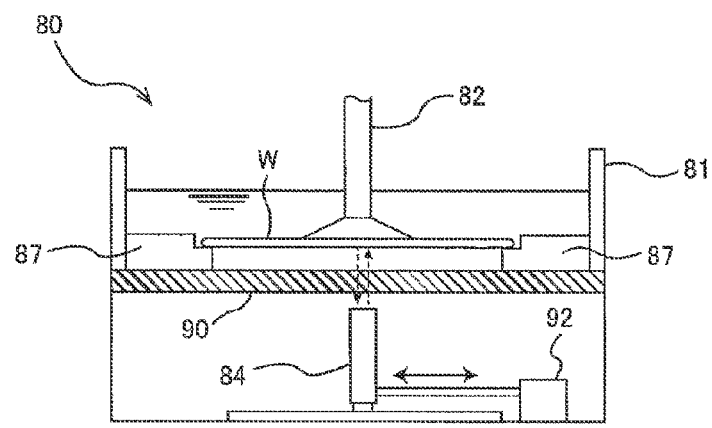

With the wafer W oriented to the predetermined direction, the holding device 82 is lowered to immerse the wafer W into the water in the water reservoir 81. A plurality of measurement pedestals 87 are disposed in the water reservoir 81, so that the wafer W is placed onto these measurement pedestals 87, as shown in FIG. 6B. When the periphery of the wafer W is placed on the measurement pedestals 87, the wafer W is maintained in a horizontal position. The water reservoir 81 has its bottom constituted by a transparent window 90. The optical film thickness measuring head 84 is arranged below the transparent window 90. The optical film thickness measuring head 84 is configured to irradiate the wafer W in the water with light through the transparent window 90, receive the light reflected from the wafer W, and determine the film thickness of the wafer W from optical information contained in the reflected light. The principle of the film thickness measurement of the optical film thickness measuring head 84 is basically the same as that of the optical film thickness sensor 40. A known film thickness measuring device as disclosed in Japanese laid-open patent publication No. 9-109023 may be used as the wet-type film thickness measuring device 80.

The optical film thickness measuring head 84 is coupled to a horizontally moving mechanism 92, which is configured to move the optical film thickness measuring head 84 horizontally during measurement of the film thickness. The measurement pedestals 87 have a wafer rotating mechanism (now shown) for rotating the wafer W, so that the measurement pedestals 87 can adjust the orientation of the wafer W (i.e., the position of the wafer W in the circumferential direction) that has been detected by the orientation detector 85. The horizontally moving mechanism 92 enables the optical film thickness measuring head 84 to measure the film thickness at multiple measurement points along a radial direction of the wafer W. Further, the combination of the measurement pedestals 87 and the horizontally moving mechanism 92 enables the optical film thickness measuring head 84 to measure the film thickness at a desired point on the wafer W. During measurement of the film thickness, the wafer W in the water reservoir 81 is in a stationary state and placed horizontally. Therefore, the wet-type film thickness measuring device 80 can measure the film thickness more accurately than the optical film thickness measuring sensor 40 that measures the film thickness of the rotating wafer. The measured value of the film thickness obtained by the wet-type film thickness measuring device 80 is transmitted to the operation controller 5.

Referring back to FIG. 3, a temporary base 72 for the wafer W is arranged beside the swing transporter 12. This temporary base 72 is mounted to a non-illustrated frame. As shown in FIG. 3, the temporary base 72 is arranged adjacent to the first linear transporter 6 and located between the first linear transporter 6 and the cleaning section 4. The swing transporter 12 is configured to move between the fourth transfer position TP4, the fifth transfer position TP5, and the temporary base 72. In this embodiment, when the wafer is transported between the polishing units 3A to 3D, the wafer is released from the top ring and is delivered to other polishing unit through the linear transporters 6 and 7. It is noted that a device for transporting the wafer between the polishing units is not limited to this embodiment. For example, the top ring may transport the wafer directly to other polishing unit while holding the wafer thereon.

The wafer W, placed on the temporary base 72, is transported to the cleaning section 4 by a first transfer robot 77 of the cleaning section 4. As shown in FIG. 3, the cleaning section 4 includes a first cleaning device 73 and a second cleaning device 74 for cleaning the polished wafer with a cleaning liquid, and a drying device 75 for drying the cleaned wafer. The first transfer robot 77 is configured to transport the wafer from the temporary base 72 to the first cleaning device 73 and further transport the wafer from the first cleaning device 73 to the second cleaning device 74. A second transfer robot 78 is arranged between the second cleaning device 74 and the drying device 75. This second transfer robot 78 is operable to transport the wafer from the second cleaning device 74 to the drying device 75.

The dried wafer is removed from the drying device 75 by the transfer robot 22 and returned to the wafer cassette. In this manner, a sequence of processes including polishing, film-thickness measuring, cleaning, and drying is performed on the wafer.

Figure 7:
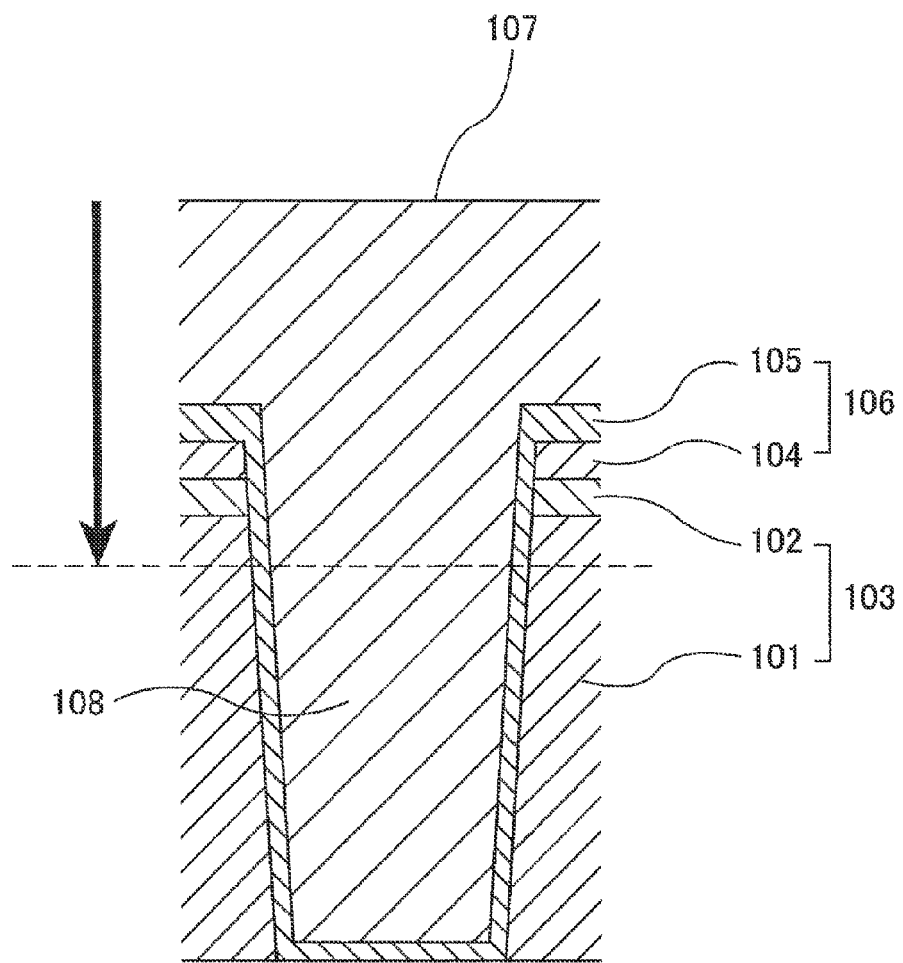
FIG. 7 is a view showing an example of a cross-sectional structure of a wafer.

Next, a method of polishing a wafer using the above-described polishing apparatus will be described. FIG. 7 is a view showing an example of a cross-sectional structure of a wafer to be polished. In this wafer, a first hard mask film 102, which is an oxide film of $SiO_2$ or the like, is formed on an interlayer dielectric film 101 which is made of $SiO_2$ or a low-k material. A second hard mask film 104 made of a metal is formed on the first hard mask film 102. A barrier film 105 made of a metal is formed so as to cover the second hard mask film 104 and a trench formed in the interlayer dielectric film 101. The interlayer dielectric film 101 and the first hard mask film 102 constitute a dielectric film 103, while the second hard mask film 104 and the barrier film 105 constitute a conductive film 106. Although not shown, in another example of the multilayer structure, the first hard mask film 102 and the second hard mask film 104 may not be provided. In this case, the barrier film 105 constitutes the conductive film 106, and the interlayer dielectric film 101 constitutes the dielectric film 103.

After the barrier film 105 is formed, the wafer is plated with copper, so that the trench is filled with copper and a copper film 107 as a metal film is deposited on the barrier film 105. Thereafter, polishing of the wafer is performed by the polishing apparatus to remove unnecessary films, i.e., the copper film 107, the barrier film 105, the second hard mask film 104, and the first hard mask film 102, leaving copper in the trench. This copper remaining in the trench, which is a part of the copper film 107, forms interconnects 108 of a semiconductor device. The polishing process is terminated when a thickness of the dielectric film 103 reaches a predetermined value, i.e., when a height of the interconnects 108 reaches a predetermined value, as indicated by a dotted line in FIG. 7.

Figure 8A:
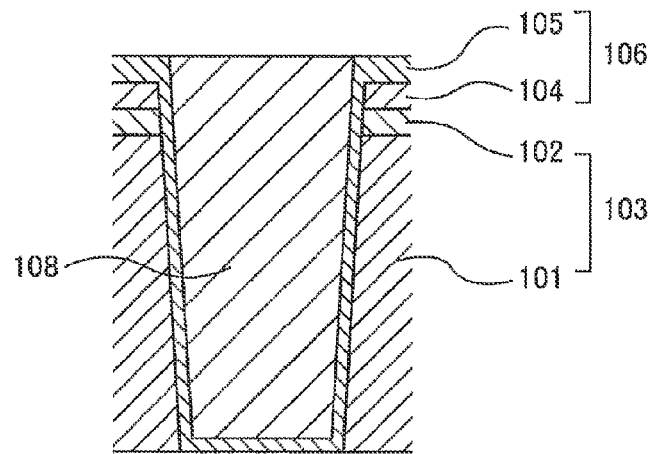
FIGS. 8A and 8B are diagrams showing the polishing method for the wafer shown in FIG. 7.
Figure 8B:
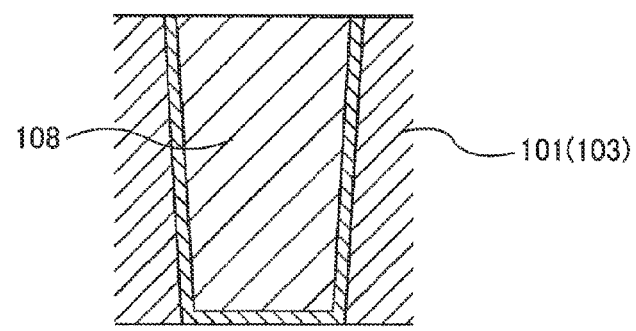

FIGS. 8A and 8B are diagrams showing a polishing method for the wafer shown in FIG. 7. The wafer having the above multilayer structure is polished in two steps by the first polishing unit 3A and the second polishing unit 3B, and at the same time, another wafer of the same structure is polished in two steps by the third polishing unit 3C and the fourth polishing unit 3D. The first step of the two-step polishing process is a process of removing the unnecessary copper film 107 until the barrier film 105 is exposed, as shown in FIG. 8A. The second step is a process of removing the barrier film 105, the second hard mask film 104, and the first hard mask film 102, and then polishing the interlayer dielectric film 101 until the thickness of the dielectric film 103 reaches a predetermined value, i.e., until the height of the interconnects 108 in the trench reaches a predetermined target value, as shown in FIG. 8B. The first step of the two-step polishing process is carried out in the first polishing unit 3A and the third polishing unit 3C, and the second step is carried out in the second polishing unit 3B and the fourth polishing unit 3D. In this manner, the two wafers are concurrently polished by the polishing units 3A and 3B and the polishing units 3C and 3D, respectively.

In polishing of the dielectric film 103, a film thickness signal of the dielectric film 103 is obtained by the optical film thickness sensor 40. The operation controller 5 produces from the film thickness signal a film thickness index value which directly or indirectly indicates the thickness of the dielectric film 103 and stops polishing of the dielectric film 103 when the film thickness index value reaches a predetermined threshold value (i.e. when the thickness of the dielectric film 103 reaches a predetermined target value). Alternatively, the operation controller 5 may determine a polishing end point of the dielectric film 103 from a removal amount of the dielectric film 103 (i.e., an amount of the dielectric film 103 removed by the polishing process). Specifically, instead of producing the film thickness index value, the operation controller 5 may produce from the film thickness signal a removal index value which directly or indirectly indicates the removal amount of the dielectric film 103, and may stop polishing of the dielectric film 103 when the removal index value reaches a threshold value (i.e., when the removal amount of the dielectric film 103 reaches a predetermined target value). In this case also, it is possible to polish the dielectric film 103 until the thickness thereof reaches the predetermined target value.

Figure 9:
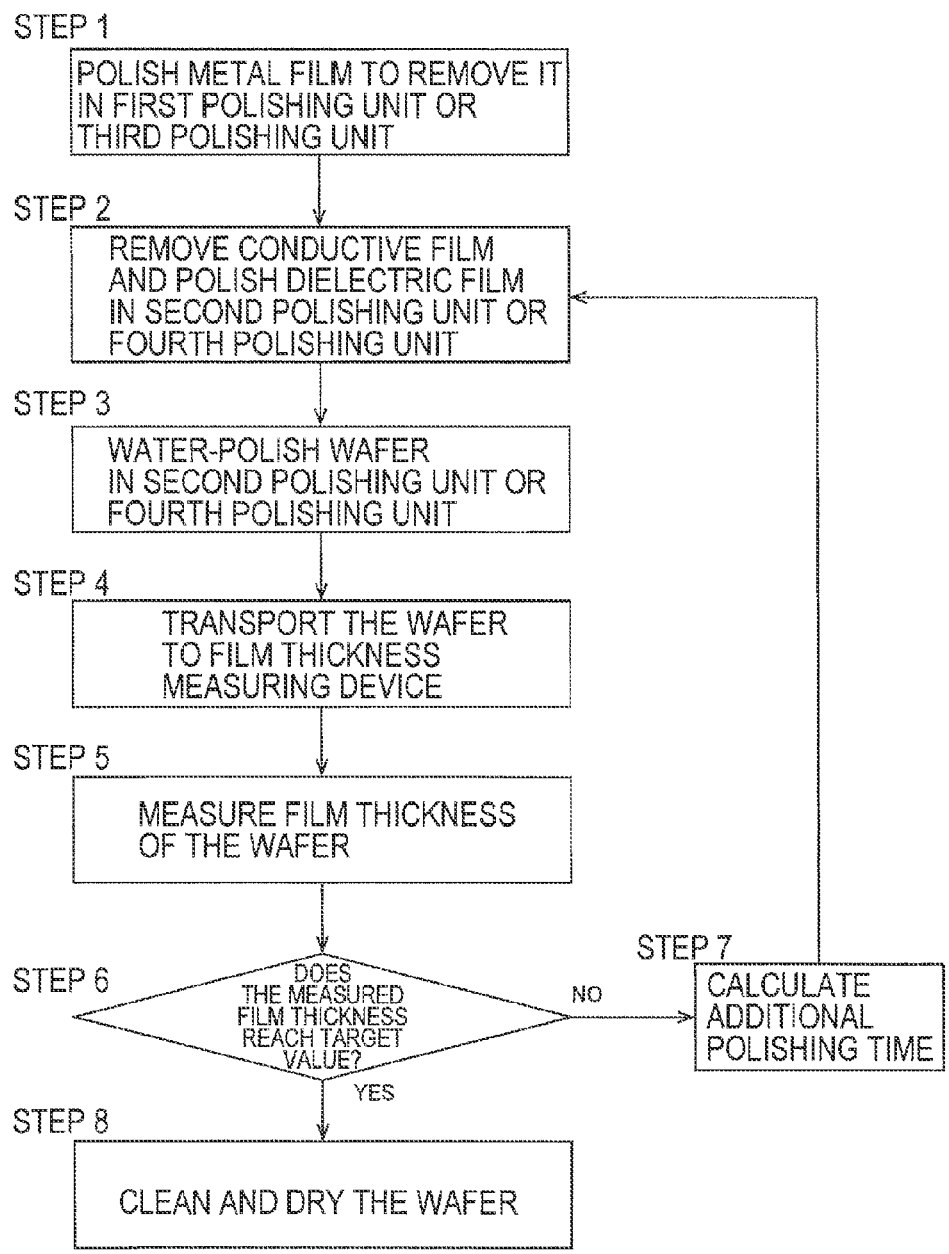
FIG. 9 is a flowchart for illustrating the polishing method shown in FIG. 8A and FIG. 8B.

FIG. 9 is a flowchart for illustrating a method of polishing the wafer shown in FIGS. 8A and 8B. In step 1, while the polishing liquid is supplied onto the polishing pad 10 on the first polishing table 30A or the third polishing table 30C, the copper film (i.e., a metal film) 107 is polished until the barrier film 105, constituting the conductive film 106, is exposed. This step 1 corresponds to the first polishing process shown in FIG. 8A. In step 2, while the polishing liquid is supplied onto the polishing pad 10 on the second polishing table 30B or the fourth polishing table 30D, the conductive film 106 is polished until the dielectric film 103 is exposed, and further the dielectric film 103 is polished until its thickness reaches a predetermined target value. More specifically, the barrier film 105, the second hard mask film 104, and the first hard mask film 102 are removed, and further the interlayer dielectric film 101 is polished. This step 2 corresponds to the second polishing process shown in FIG. 8B.

In step 3, the wafer is water-polished while pure water, instead of the polishing liquid, is supplied onto the polishing pad 10 on the second polishing table 30B or the fourth polishing table 30D. This water polishing removes the polishing liquid and polishing debris from the wafer. In step 4, the polished wafer, with its surface wet, is transported to the wet-type film thickness measuring device 80.

In step 5, the thickness of the polished dielectric film 103 is measured by the wet-type film thickness measuring device 80. Measurement result of the film thickness is sent to the operation controller 5. In step 6, the operation controller 5 compares the measured current film thickness with the predetermined target value. If the measured film thickness has not reached the target value, then the operation controller 5 calculates an additional polishing time that is necessary to achieve the target value from a difference between the measured film thickness and the target value (step 7). The additional polishing time can be calculated from a polishing rate and the difference between the current film thickness and the target value of the dielectric film 103. The wafer is again transported to the polishing pad 10 on the second polishing table 30B or the fourth polishing table 30D, and is re-polished for the calculated additional polishing time while the polishing liquid is supplied onto the polishing pad 10. If the measured film thickness has reached the target value, then the wafer is transported to the cleaning section 4, where the wafer is cleaned and dried (step 8). The film thickness measurement in the steps 4 and 5 and the comparison of the measured film thickness with the target value in the step 6 after re-polishing of the wafer may be omitted.

Measurement of the film thickness in the wet-type film thickness measuring device 80 and/or re-polishing of the wafer may cause subsequent wafer(s) to wait for processing thereof in the polishing unit or other unit. In such a case, in order to prevent an increase in defects, such as drying and corrosion, on a surface of the wafer waiting for processing, pure water or a chemical liquid having a cleaning effect or a corrosion preventing effect, may be sprayed intermittently onto the wafer held by the top ring, or held by the linear transporter at the transfer position, by means of a spray (not shown) which is installed along a wafer transport route, e.g., on the first linear transporter 6, the second linear transporter 7, or the swing transporter 12. Furthermore, the operation controller 5 may calculate a delay in a polishing start time of the subsequent wafer(s), due to re-polishing of the preceding wafer, so as to adjust a polishing time of the subsequent wafer(s) or a timing of starting polishing of the subsequent wafer(s). It is also possible to set a process waiting time of the subsequent wafer(s) in advance for permitting re-polishing of the preceding wafer, in order to control a timing of carrying the subsequent wafer(s) into the polishing apparatus. Such an operation for the subsequent wafer(s), associated with re-polishing of the preceding wafer, can also be applied to embodiments which will be discussed later.

The wet-type film thickness measuring device 80 measures the film thickness at desired measurement points on the wafer, and the operation controller 5 creates a polishing profile of the wafer from the measured values of the film thickness. The polishing profile represents a cross-sectional shape of the film. The operation controller 5 is configured to control the polishing pressure of the top ring 31A, i.e., the pressures in the pressure chambers P1, P2, P3, and P4 shown in FIG. 5, based on the polishing profile created. For example, if the thickness of the film is larger in the edge of the wafer than in the other area, the pressure in the pressure chamber P4, corresponding to the edge of the wafer, is increased.

Polishing conditions, such as the polishing time, the polishing pressure, the rotational speed of the polishing table, etc. can be adjusted based on the film thickness measurement results obtained by the wet-type film thickness measuring device 80. For example, in a case where the end point of each polishing process is managed by the polishing time, each polishing process is terminated when a preset polishing time has elapsed. In this case, based on the film thickness measurement results, the preset polishing time can be adjusted to an optimal polishing time for achieving a target film thickness. Furthermore, set pressures (set polishing pressures) in the pressure chambers P1, P2, P3, and P4 can be adjusted to optimal pressures for making the thickness of the dielectric film 103 uniform or as desired thickness distribution. The polishing conditions adjusted in this manner can be applied to re-polishing of the wafer and can also be applied to polishing of the subsequent wafer(s). Thus, the subsequent wafer(s) can be polished for the optimal polishing time with the optimal polishing pressure. Furthermore, a threshold value of the film thickness index value or the removal index value for polishing of the dielectric film 103 can also be adjusted. It is also possible to additionally polish (over-polish) the wafer for a predetermined period of time after the film thickness index value or the removal index value has reached the threshold value. In this case, the predetermined period of time for over-polishing the wafer may be adjusted based on the film thickness measurement results.

The measurement of the film thickness and re-polishing of the wafer are performed prior to cleaning and drying of the wafer. This can reduce a time required for starting the re-polishing process, and therefore can increase the throughput. Further, the measurement of the film thickness is performed shortly after polishing of the wafer and the polishing conditions are adjusted based on the measurement results. Therefore the adjusted polishing conditions can be applied immediately to polishing of the next wafer. As a result, it is not necessary to keep the next wafer waiting for processing thereof, thereby increasing the throughput. In addition, an accuracy of polishing of the subsequent wafer(s) can be improved by applying the optimized polishing conditions to polishing of the subsequent wafer(s).

Figure 10A:
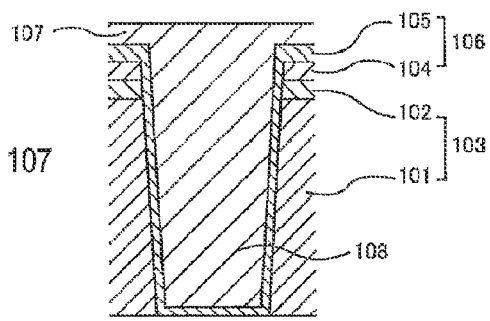
FIGS. 10A, 10B, 10C, and 10D are diagrams showing another example of the polishing method for the wafer shown in FIG. 7.

Another embodiment of the polishing method will be described. In this embodiment, the wafer shown in FIG. 7 is polished using the four polishing tables 30A, 30B, 30C, and 30D. Specifically, in the first polishing process, the copper film 107 is polished in the first polishing unit 3A until the thickness thereof reaches a predetermined target value, as shown in FIG. 10A. In polishing of the copper film 107, the film thickness signal of the copper film 107 is obtained by the eddy-current film thickness sensor 60. The operation controller 5 produces from the film thickness signal the film thickness index value which directly or indirectly indicates the thickness of the copper film 107, monitors polishing of the copper film 107 based on the film thickness index value, and stops polishing of the copper film 107 when the film thickness index value reaches a predetermined threshold value (i.e., when the thickness of the copper film 107 reaches the predetermined target value).

Figure 10B:
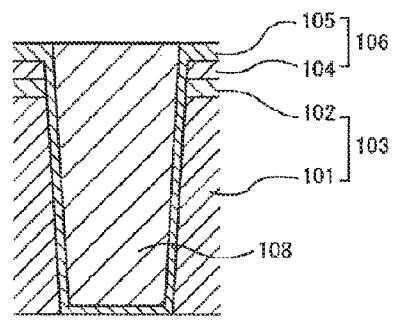

The wafer that has been polished in the first polishing unit 3A is transported to the second polishing unit 3B, where the wafer is subjected to the second polishing process. As shown in FIG. 10B, in the second polishing process, the remaining copper film 107 is polished until the barrier film 105, lying underneath the copper film 107, is exposed. A point of time when the barrier film 105 is exposed as a result of the removal of the copper film 107 is detected based on the film thickness index value by the operation controller 5. For example, a removal point of the copper film 107 can be determined from a point when the film thickness index value reaches a predetermined threshold value. If the polishing liquid used has properties such that the copper film 107 is polished at a high polishing rate while the barrier film 105 is polished at a low polishing rate, polishing of the wafer does not progress any more once the copper film 107 is removed and the barrier film 105 is exposed. In this case, the film thickness index value does not change any more. Therefore, the point of time when the film thickness index value stops changing may be determined to be the point of time when the copper film 107 is removed.

Figure 10C:
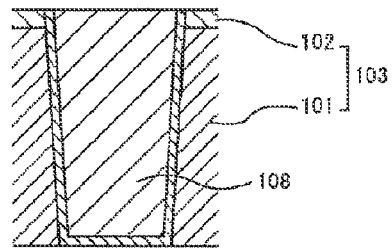

The wafer that has been polished in the second polishing unit 3B is transported to the third polishing unit 3C, where the wafer is subjected to the third polishing process. As shown in FIG. 10C, in the third polishing process, the barrier film 105 and the second hard mask film 104, constituting the conductive film 106, are removed. Specifically, the conductive film 106 is polished until the dielectric film 103, lying underneath the conductive film 106, is exposed (i.e., until the first hard mask film 102 is exposed). In polishing of the conductive film 106, the film thickness signal of the conductive film 106 is obtained by the eddy-current film thickness sensor 60. The operation controller 5 produces the film thickness index value of the conductive film 106 from the film thickness signal, monitors polishing of the conductive film 106 based on the film thickness index value, and stops polishing of the wafer when the film thickness index value reaches a predetermined threshold value or when the film thickness index value stops changing (i.e., when the second hard mask film 104 of the conductive film 106 is removed and the first hard mask film 102 is exposed).

Figure 10D:
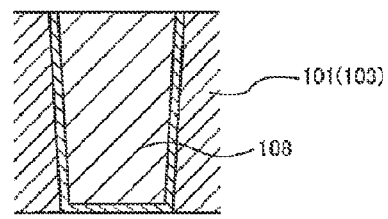

The polished wafer is transported from the third polishing unit 3C to the fourth polishing unit 3D, where the wafer is subjected to the fourth polishing process. As shown in FIG. 10D, in the fourth polishing process, the dielectric film 103, which is constituted by the first hard mask film 102 and the interlayer dielectric film 101, is polished. Polishing of the dielectric film 103 includes removing of the first hard mask film 102 and polishing of the interlayer dielectric film 101. The dielectric film 103 is polished until its thickness reaches a predetermined target value.

In polishing of the dielectric film 103, the film thickness signal of the dielectric film 103 is obtained by the optical film thickness sensor 40. The operation controller 5 produces the film thickness index value or the removal index value of the dielectric film 103 from the film thickness signal and stops polishing of the dielectric film 103 when the film thickness index value or the removal index value reaches a predetermined threshold value (i.e., when the thickness of the dielectric film 103 or the removal amount of the film 103 reaches the predetermined target value).

Figure 11:
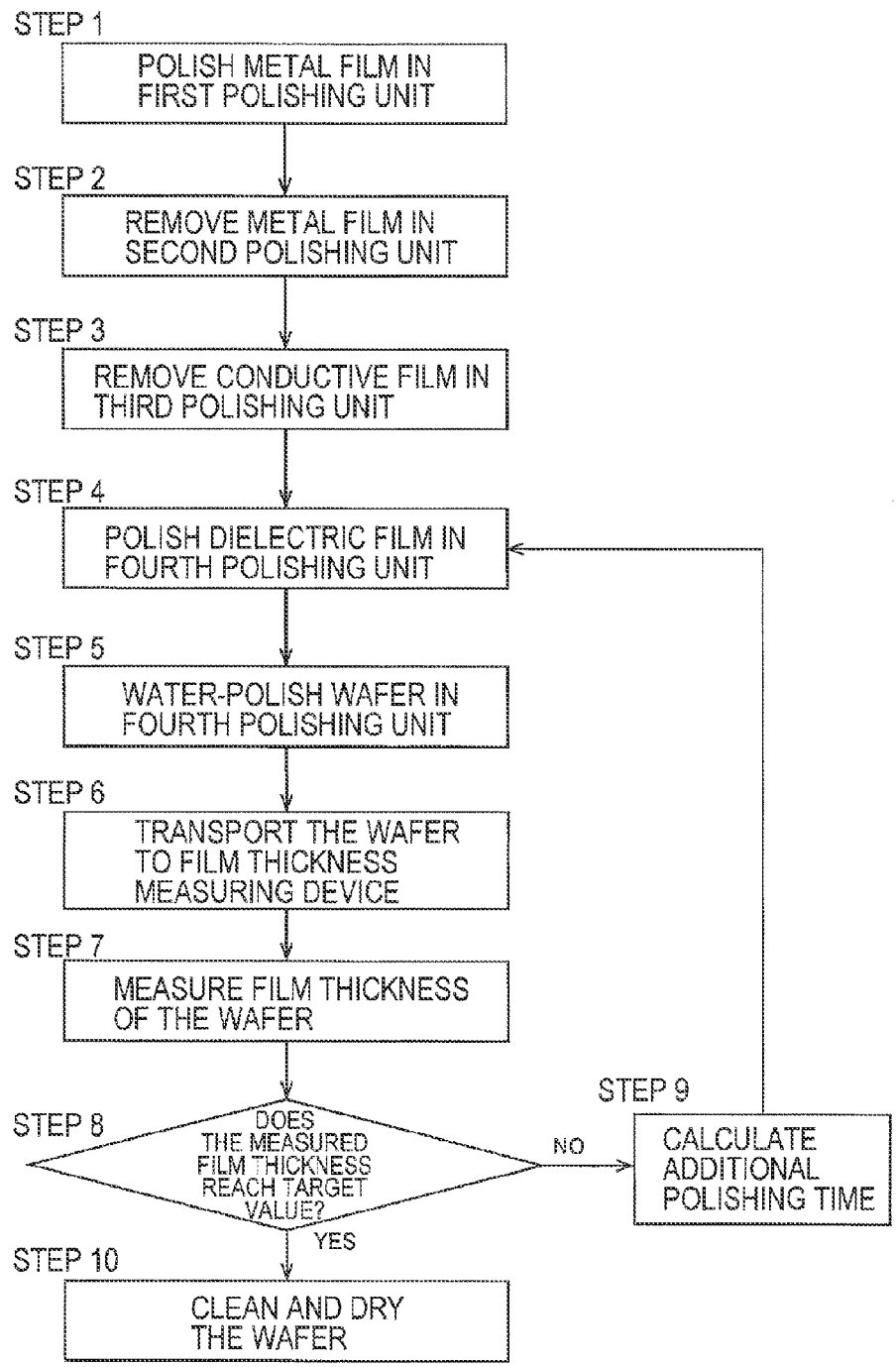
FIG. 11 is a flowchart for illustrating the polishing method shown in FIG. 10A through FIG. 10D.

FIG. 11 is a flowchart for illustrating the wafer polishing method shown in FIGS. 10A through 10D. In step 1, while the polishing liquid is supplied onto the polishing pad 10 on the first polishing table 30A, the copper film (i.e., the metal film) 107 is polished until its thickness reaches a predetermined target value. This step 1 corresponds to the first polishing process shown in FIG. 10A. In step 2, while the polishing liquid is supplied onto the polishing pad 10 on the second polishing table 30B, the copper film (i.e., the metal film) 107 is polished until the barrier film 105, constituting the conductive film 106, is exposed. This step 2 corresponds to the second polishing process shown in FIG. 10B.

In step 3, while the polishing liquid is supplied onto the polishing pad 10 on the third polishing table 30C, the barrier film 105 and the second hard mask film 104, which constitute the conductive film 106, are polished. This polishing of the conductive film 106 is performed until the dielectric film 103 is exposed. This step 3 corresponds to the third polishing process shown in FIG. 10C. In step 4, while the polishing liquid is supplied onto the polishing pad 10 on the fourth polishing table 30D, the dielectric film 103 is polished until its thickness reaches a predetermined target value. This step 4 corresponds to the fourth polishing process shown in FIG. 10D.

In step 5, the wafer is water-polished while pure water, instead of the polishing liquid, is supplied onto the polishing pad 10 on the fourth polishing table 30D. The water polishing removes the polishing liquid and polishing debris from the wafer. In step 6, the polished wafer is transported to the wet-type film thickness measuring device 80.

In step 7, the thickness of the polished dielectric film 103 is measured by the wet-type film thickness measuring device 80. The measurement result of the film thickness is sent to the operation controller 5. In step 8, the operation controller 5 compares the measured current film thickness with a predetermined target value. If the measured film thickness has not reached the predetermined target value, then the operation controller 5 calculates an additional polishing time that is necessary to achieve the target value from a difference between the measured film thickness and the target value (step 9). The wafer is again transported to the polishing pad 10 on the fourth polishing table 30D, and is re-polished for the calculated additional polishing time while the polishing liquid is supplied onto the polishing pad 10. If the measured film thickness has reached the target value, the wafer is then transported to the cleaning section 4, where the wafer is cleaned and dried (step 10). The film thickness measurement in the steps 6 and 7 and the comparison of the measured film thickness with the target value in the step 8 after the re-polishing of the wafer may be omitted.

In the third polishing process, it is preferable to use a highly-selective polishing liquid which contains abrasive grains and/or chemical composition capable of increasing the polishing rate of the conductive film 106 while lowering the polishing rate of the dielectric film 103. When using such a polishing liquid, polishing of the wafer does not substantially progress after the dielectric film 103 is exposed. Therefore, the operation controller 5 is able to detect the polishing end point of the conductive film 106 (i.e., the point of time when the dielectric film 103 is exposed) more accurately.

When using such a highly-selective polishing liquid in the third polishing process, it is possible to detect the polishing end point of the conductive film 106 (i.e., the point of time when the dielectric film 103 is exposed) based on the torque current of the table motor 19 (see FIG. 4) that rotates the polishing table 30C. A frictional force is generated between the wafer and the polishing pad 10 because the surface of the wafer and the polishing surface of the polishing pad 10 are placed in sliding contact with each other during polishing of the wafer. This frictional force varies depending on the type of film that forms the exposed surface of the wafer and the type of polishing liquid used.

The table motor 19 is controlled so as to rotate the polishing table 30C at a preset constant speed. Accordingly, the electric current flowing into the table motor 19, i.e., the torque current, changes upon a change in the frictional force acting between the wafer and the polishing pad 10. More specifically, when the frictional force increases, the torque current increases so as to enable the table motor 19 to exert a higher torque on the polishing table 30C. Conversely, when the frictional force decreases, the torque current decreases so that the table motor 19 exerts a lower torque on the polishing table 30C. Thus, the operation controller 5 can detect the polishing end point of the conductive film 106 (i.e., the point of time when the dielectric film 103 is exposed) from the change in the torque current of the table motor 19. The torque current is measured by the torque current measuring device 70 shown in FIG. 4.

Figure 12A:
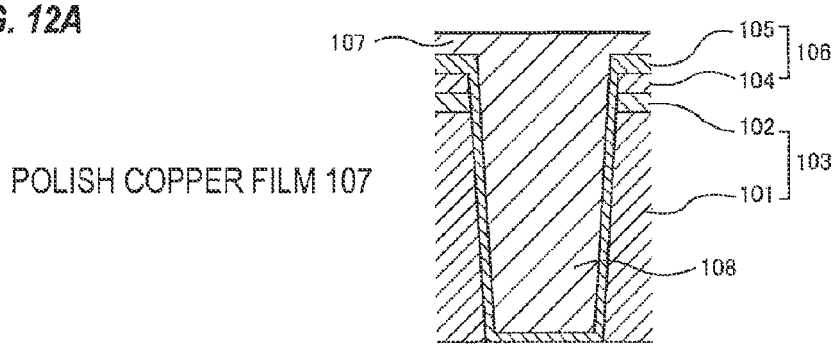
FIGS. 12A, 12B, 12C, and 12D are diagrams showing still another example of the polishing method for the wafer shown in FIG. 7.
Figure 12B:
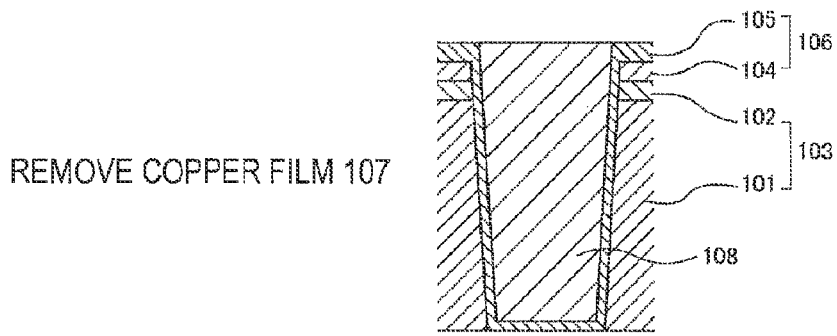

Another embodiment of the polishing method will be described. Also in this embodiment, the wafer shown in FIG. 7 is polished using the four polishing tables 30A, 30B, 30C, and 30D. The first polishing process and the second polishing process for the metal film shown in FIGS. 12A and 12B are performed in the same manner as in the above-described first polishing process and second polishing process shown in FIGS. 10A and 10B, and hence duplicate descriptions thereof will be omitted.

Figure 12C:
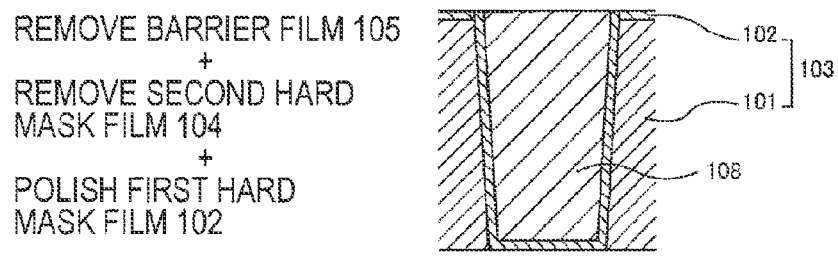

The wafer that has been polished in the second polishing unit 3B is transported to the third polishing unit 3C, where the wafer is subjected to the third polishing process. As shown in FIG. 12C, in the third polishing process, the conductive film 106 is polished until the dielectric film 103 is exposed, and further the exposed dielectric film 103 is polished. More specifically, the barrier film 105 and the second hard mask film 104, which constitute the conductive film 106, are removed and then the dielectric film 103, lying underneath the conductive film 106, is polished until its thickness reaches a predetermined first target value. The thickness of the dielectric film 103 may be determined from the amount of the dielectric film 103 removed (which will be referred to as removal amount). The polishing of the dielectric film 103 in the third polishing process includes removing of the first hard mask film 102 and polishing of the interlayer dielectric film 101, or only polishing of the first hard mask film 102. FIG. 12C illustrates an example in which the first hard mask film 102 is polished after polishing of the conductive film 106, but the interlayer dielectric film 101 is not polished.

In polishing of the conductive film 106 in the third polishing process, the film thickness signal of the conductive film 106 is obtained by the eddy-current film thickness sensor 60. The operation controller 5 produces the film thickness index value of the conductive film 106 from the film thickness signal, monitors polishing of the conductive film 106 based on the film thickness index value, and detects a point of time when the film thickness index value reaches a predetermined threshold value or when the film thickness index value stops changing (i.e., a point of time when the conductive film 106 is removed and the dielectric film 103 is exposed). In the third polishing process, the conductive film 106 and the dielectric film 103 are polished successively. In polishing of the dielectric film 103, the film thickness signal of the dielectric film 103 is obtained by the optical film thickness sensor 40. The operation controller 5 produces the film thickness index value or the removal index value of the dielectric film 103 from the film thickness signal and stops polishing of the dielectric film 103 when the film thickness index value or the removal index value reaches a predetermined first threshold value (i.e., when the thickness or the removal amount of the dielectric film 103 reaches a predetermined first target value).

Figure 12D:
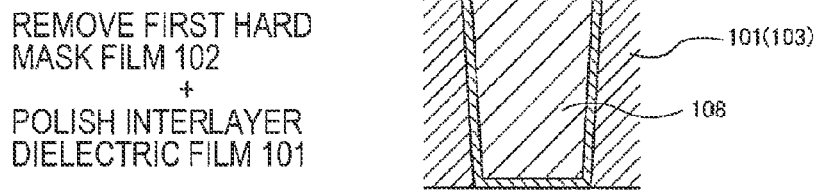

The wafer that has been polished in the third polishing unit 3C is transported to the wet-type film thickness measuring device 80, where the film thickness of the wafer is measured. After the film thickness measurement, the wafer is transported to the fourth polishing unit 3D, where the wafer is subjected to the fourth polishing process. As shown in FIG. 12D, the dielectric film 103 is polished in the fourth polishing process. The dielectric film 103 is polished until its thickness reaches a predetermined second target value. The polishing of the dielectric film 103 includes removing of the first hard mask film 102 and polishing of the interlayer dielectric film 101, or only polishing of the interlayer dielectric film 101. FIG. 12D illustrates an example in which the first hard mask film 102 is removed and subsequently the interlayer dielectric film 101 is polished.

FIG. 13 is a flowchart for illustrating the wafer polishing method shown in FIGS. 12A through 12D. In step 1, while the polishing liquid is supplied onto the polishing pad 10 on the first polishing table 30A, the copper film (i.e., the metal film) 107 is polished until its thickness reaches a predetermined target value. This step 1 corresponds to the first polishing process shown in FIG. 12A. In step 2, while the polishing liquid is supplied onto the polishing pad 10 on the second polishing table 30B, the copper film (i.e., the metal film) 107 is polished until the barrier film 105, constituting the conductive film 106, is exposed. This step 2 corresponds to the second polishing process shown in FIG. 12B.

In step 3, while the polishing liquid is supplied onto the polishing pad 10 on the third polishing table 30C, the barrier film 105 and the second hard mask film 104, which constitute the conductive film 106, are polished, and further the underlying dielectric film 103 is polished until its thickness reaches a predetermined first target value. This step 3 corresponds to the third polishing process shown in FIG. 12C. In step 4, the wafer is water-polished while pure water, instead of the polishing liquid, is supplied onto the polishing pad 10 on the third polishing table 30C. The water polishing removes the polishing liquid and polishing debris from the wafer. In step 5, the polished wafer is transported to the wet-type film thickness measuring device 80.

In step 6, the thickness of the polished dielectric film 103 is measured by the wet-type film thickness measuring device 80. The measurement result of the film thickness is sent to the operation controller 5. In step 7, the operation controller 5 compares the measured current film thickness with a predetermined second target value which is a final target value of the film thickness. If the measured film thickness has not reached the second target value, then the operation controller 5 calculates an additional polishing time that is necessary to achieve the second target value from a difference between the measured film thickness and the second target value (step 8). The additional polishing time can be calculated from a polishing rate and the difference between the measured film thickness of the dielectric film 103 and the second target value. In step 9, the wafer is transported to the polishing pad 10 on the fourth polishing table 30D, and is re-polished for the calculated additional polishing time while the polishing liquid is supplied onto the polishing pad 10. This step 9 corresponds to the fourth polishing process shown in FIG. 12D. It is also possible to transport the wafer to the polishing pad 10 on the third polishing table 30C and to carry out re-polishing of the wafer with the polishing pad 10 on the third polishing table 30C.

In step 10, the wafer is water-polished while pure water, instead of the polishing liquid, is supplied onto the polishing pad 10 on the fourth polishing table 30D. Thereafter, the process flow returns back to the step 5. If the measured film thickness has reached the target value, then the wafer is transported to the cleaning section 4, where the wafer is cleaned and dried (step 11).

The film thickness of the wafer is expected to reach the target value by polishing the wafer for the additional polishing time calculated in the step 8. Therefore, after the steps 9 and 10, the wafer may be cleaned and dried as the step 11 so that processing of the wafer is completed, without returning to the step 5 for re-measurement of the film thickness. Such omission of the measurement of the film thickness after re-polishing of the wafer can also be applied to the above-described embodiments and to below-described embodiments.

The method of this embodiment, which has been described with reference to FIGS. 12A through 12C and FIG. 13, includes the steps of polishing a wafer until a film thickness of the wafer reaches a first target value which is near a second or final target value, measuring the film thickness of the polished wafer with the wet-type film thickness measuring device 80, calculating an additional polishing time that is necessary for eliminating the difference between the measured current film thickness and the second target value, and re-polishing the wafer for the additional polishing time. This embodiment, which includes the steps of intentionally stopping the polishing of the wafer before the final target value of the film thickness is reached, measuring the film thickness, and then re-polishing the wafer, can also be applied to the above-described embodiments and to below-described embodiments.

Figure 14:
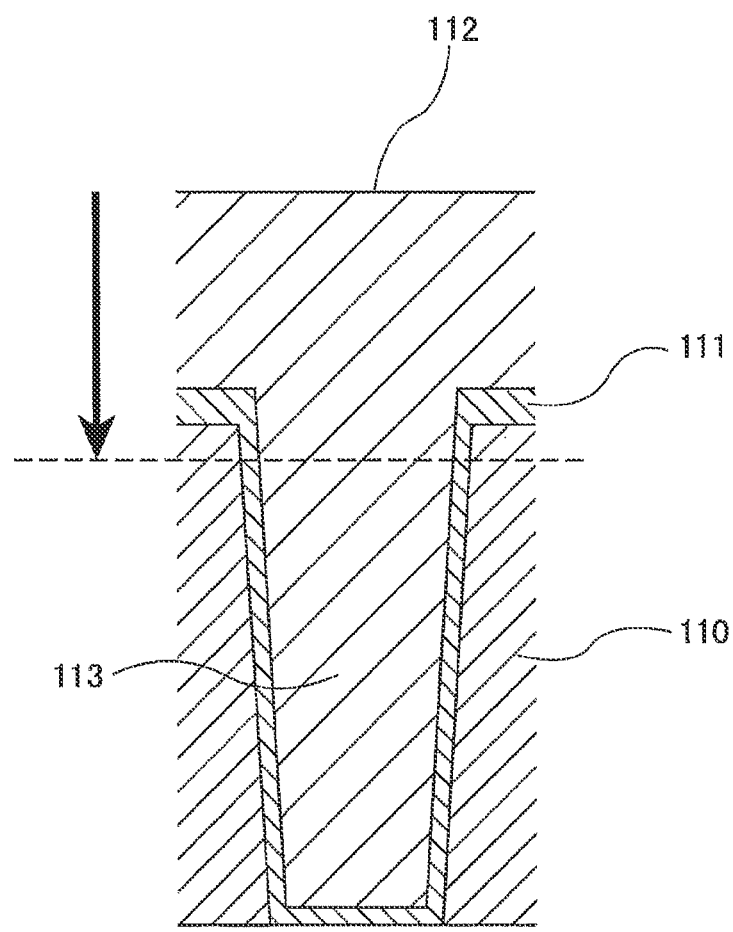
FIG. 14 is a cross-sectional view of a multilayer structure constituted by a tungsten film, a barrier film, and a dielectric film.

The above-discussed polishing method can also be applied to polishing of a wafer having other multilayer structures. FIG. 14 is a cross-sectional view of a multilayer structure constituted by a tungsten film, a barrier film, and a dielectric film. In this wafer, a barrier film 111 as a conductive film is formed so as to cover a dielectric film 110 and trenches formed in this dielectric film 110. The dielectric film 110 is formed of $SiO_2$, a low-k material, or the like, while the barrier film 111 is formed of a metal, such as Ti or TiN. A tungsten film 112 as a metal film is formed so as to cover the barrier film 111. The trenches are filled with the tungsten film 112. As shown by a dotted line in FIG. 14, the wafer is polished until unnecessary portions of the tungsten film 112 and the barrier film 111 are removed and the thickness of the dielectric film 110 reaches a predetermined value. Tungsten that exists in the trenches is a part of the tungsten film 112 and this tungsten forms interconnects 113 of a semiconductor device.

Figure 15A:
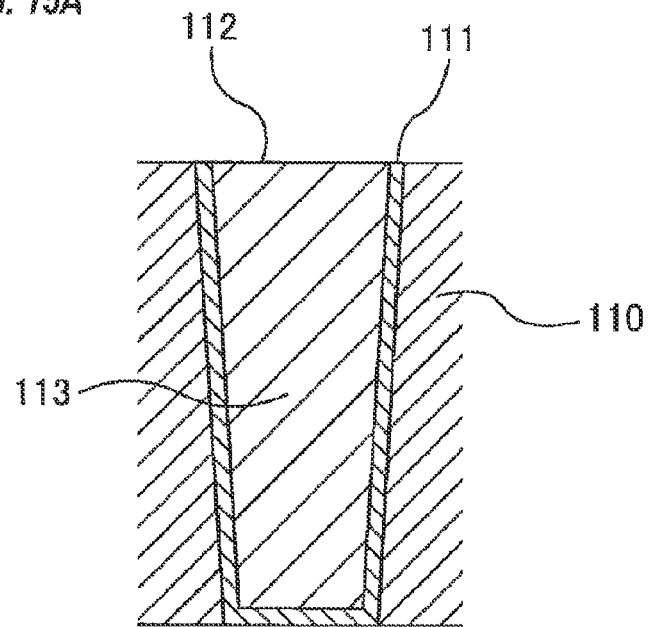
FIGS. 15A and 15B are diagrams showing the polishing method for the wafer shown in FIG. 14.
Figure 15B:
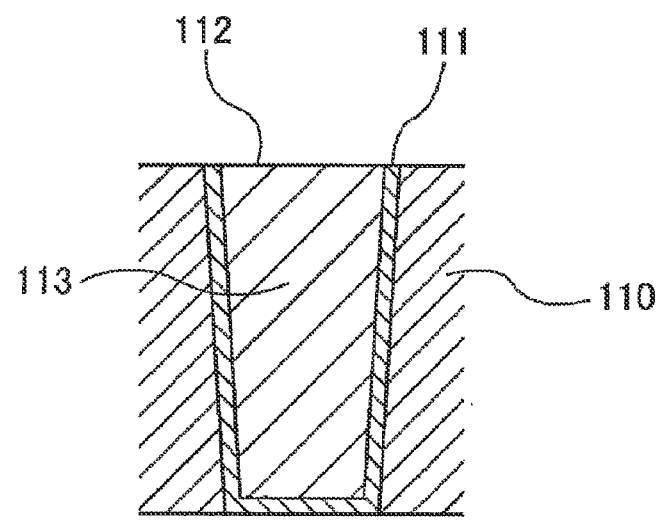

FIGS. 15A and 15B are diagrams illustrating an exemplary polishing method for the wafer shown in FIG. 14. The wafer having the above-described multilayer structure is polished in two steps in the first polishing unit 3A and the second polishing unit 3B while, at the same time, another wafer having the same construction is polished in two steps in the third polishing unit 3C and the fourth polishing unit 3D. As shown in FIG. 15A, the first step of the two-step polishing process is a process of removing the tungsten film 112 and the barrier film 111 until the dielectric film 110 is exposed. As shown in FIG. 15B, the second step is a process of polishing the dielectric film 110 until the thickness of the dielectric film 110 reaches a predetermined target value (i.e. until the height of the interconnects 113 in the trenches reaches a predetermined target value). The first step of the two-step polishing process is carried out in the first polishing unit 3A and the third polishing unit 3C, and the second step is carried out in the second polishing unit 3B and the fourth polishing unit 3D.

Figure 16:
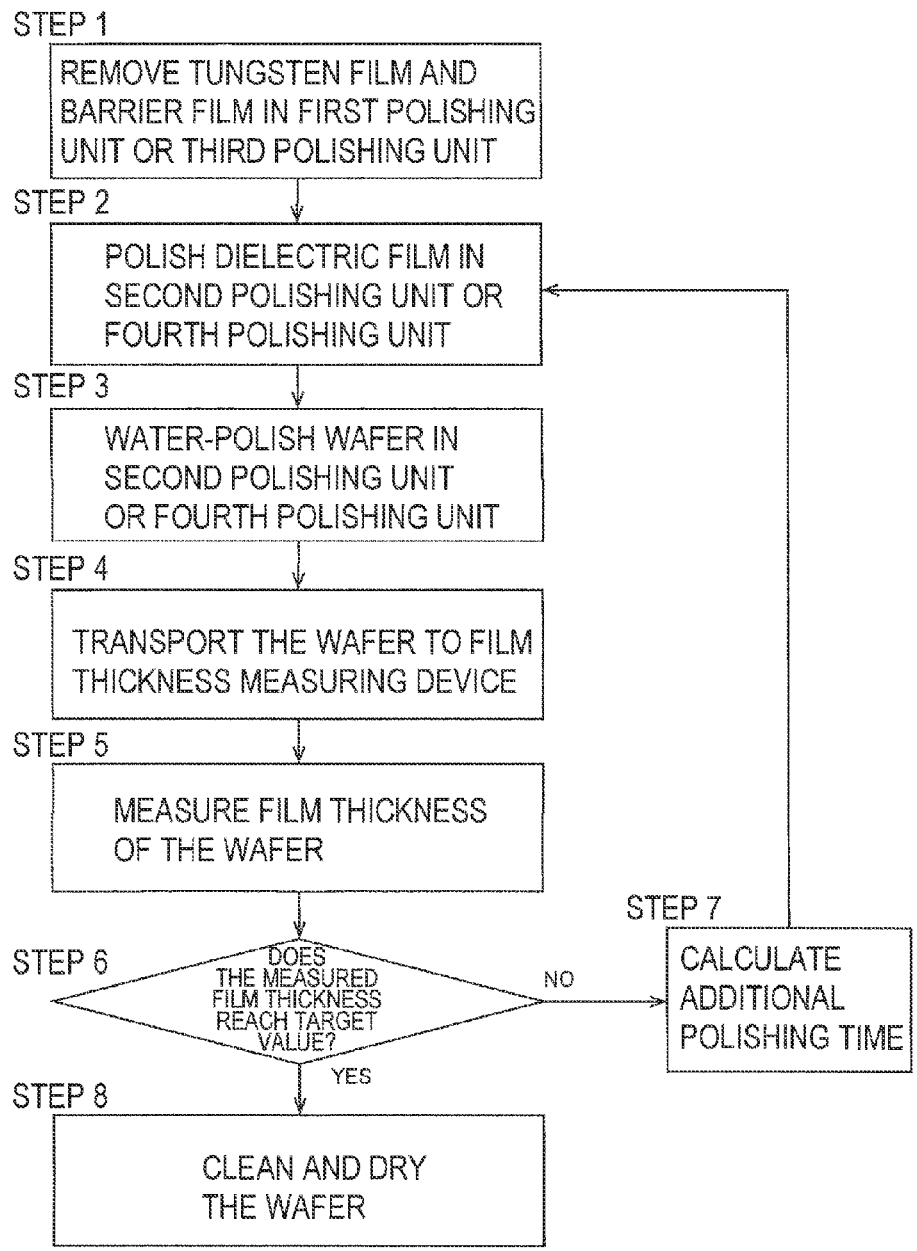
FIG. 16 is a flowchart for illustrating the polishing method shown in FIG. 15A and FIG. 15B.

FIG. 16 is a flowchart for illustrating the wafer polishing method shown in FIGS. 15A and 15B. In step 1, while the polishing liquid is supplied onto the polishing pad 10 on the first polishing table 30A or the third polishing table 30C, the tungsten film (i.e., the metal film) 112 and the barrier film 111 are polished until the dielectric film 110 is exposed. This step 1 corresponds to the first polishing process shown in FIG. 15A. In step 2, while the polishing liquid is supplied onto the polishing pad 10 on the second polishing table 30B or the fourth polishing table 30D, the dielectric film 110 is polished until its thickness reaches a predetermined target value. This step 2 corresponds to the second polishing process shown in FIG. 15B.

In polishing of the dielectric film 110, the film thickness signal of the dielectric film 110 is obtained by the optical film thickness sensor 40. The operation controller 5 produces the film thickness index value or the removal index value of the dielectric film 110 from the film thickness signal and stops polishing of the dielectric film 110 when the film thickness index value or the removal index value reaches a predetermined threshold value (i.e., when the thickness of the dielectric film 110 or the removal amount of the dielectric film 110 reaches the predetermined target value).

In step 3, the wafer is water-polished while pure water, instead of the polishing liquid, is supplied onto the polishing pad 10 on the second polishing table 30B or the fourth polishing table 30D. The water polishing removes the polishing liquid and polishing debris from the wafer. In step 4, the polished wafer is transported to the wet-type film thickness measuring device 80.

In step 5, the thickness of the polished dielectric film 110 is measured by the wet-type film thickness measuring device 80. The measurement result of the film thickness is sent to the operation controller 5. In step 6, the operation controller 5 compares the measured current film thickness with the predetermined target value. If the measured film thickness has not reached the target value, then the operation controller 5 calculates an additional polishing time that is necessary to achieve the target value from a difference between the measured film thickness and the target value (step 7). The wafer is again transported to the polishing pad 10 on the second polishing table 30B or the fourth polishing table 30D, and is re-polished for the calculated additional polishing time while the polishing liquid is supplied onto the polishing pad 10. If the measured film thickness has reached the target value, then the wafer is transported to the cleaning section 4, where the wafer is cleaned and dried (step 8). The film thickness measurement in the steps 4 and 5 and the comparison of the measured film thickness with the target value in the step 6 after the re-polishing of the wafer may be omitted.

Figure 17:
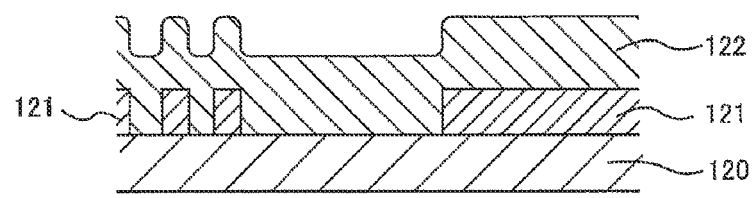
FIG. 17 is a cross-sectional view showing a wafer having an interlayer dielectric film (ILD)

Next, polishing of a wafer having another multilayer structure will be described. FIG. 17 is a cross-sectional view of a wafer having an interlayer dielectric film (ILD) formed thereon. This wafer has a multilayer structure including a base layer 120, metal interconnects 121 formed on the base layer 120, and an interlayer dielectric film 122 formed by CVD so as to cover the metal interconnects 121.

Figure 18A:
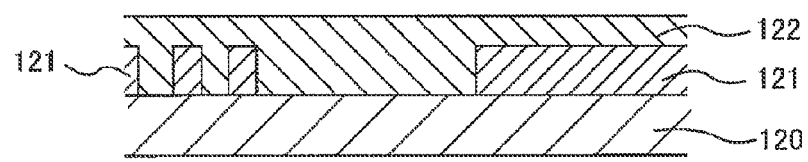
FIGS. 18A and 18B are diagrams showing an example of the polishing method for the wafer shown in FIG. 17.
Figure 18B:
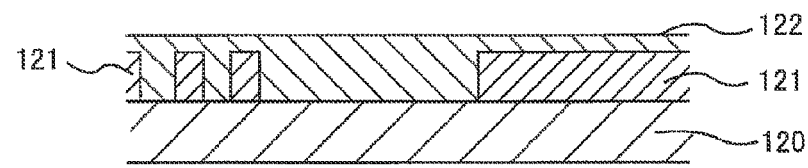

FIGS. 18A and 18B are diagrams illustrating an exemplary polishing method for the wafer shown in FIG. 17. The wafer having the above-described multilayer structure is polished in two steps in the first polishing unit 3A and the second polishing unit 3B while, at the same time, another wafer having the same construction is polished in two steps in the third polishing unit 3C and the fourth polishing unit 3D. As shown in FIG. 18A, the first step of the two-step polishing process is a process of removing stepped portions (or protruded portions), formed on a surface of the interlayer dielectric film 122, until its surface is planarized. As shown in FIG. 18B, the second step is a process of slightly polishing the interlayer dielectric film 122 to remove scratches formed on the surface thereof. The first step of the two-step polishing process is carried out in the first polishing unit 3A and the third polishing unit 3C, and the second step is carried out in the second polishing unit 3B and the fourth polishing unit 3D.

FIG. 19 is a flowchart for illustrating the wafer polishing method shown in FIGS. 18A and 18B. In step 1, while the polishing liquid is supplied onto the polishing pad 10 on the first polishing table 30A or the third polishing table 30C, the interlayer dielectric film 122 is polished until the stepped portions (or the protruded portions) on the surface of the interlayer dielectric film 122 are removed. This step 1 corresponds to the first polishing process shown in FIG. 18A. In step 2, while the polishing liquid is supplied onto the polishing pad 10 on the second polishing table 30B or the fourth polishing table 30D, the interlayer dielectric film 122 is polished until its thickness reaches a predetermined target value. This step 2 corresponds to the second polishing process shown in FIG. 18B.

In polishing of the interlayer dielectric film 122, the film thickness signal of the interlayer dielectric film 122 is obtained by the optical film thickness sensor 40. The operation controller 5 produces the film thickness index value or the removal index value of the interlayer dielectric film 122 from the film thickness signal and stops polishing of the interlayer dielectric film 122 when the film thickness index value or the removal index value reaches a predetermined threshold value (i.e., when the thickness of the interlayer dielectric film 122 or the removal amount of the interlayer dielectric film 122 reaches a predetermined target value).

In step 3, the wafer is water-polished while pure water, instead of the polishing liquid, is supplied onto the polishing pad 10 on the second polishing table 30B or the fourth polishing table 30D. This water polishing removes the polishing liquid and polishing debris from the wafer. In step 4, the polished wafer is transported to the wet-type film thickness measuring device 80.

In step 5, the thickness of the polished interlayer dielectric film 122 is measured by the wet-type film thickness measuring device 80. The measurement result of the film thickness is sent to the operation controller 5. In step 6, the operation controller 5 compares the measured current film thickness with the predetermined target value. If the measured film thickness has not reached the target value, then the operation controller 5 calculates an additional polishing time that is necessary to achieve the target value from a difference between the measured film thickness and the target value (step 7). The wafer is again transported to the polishing pad 10 on the second polishing table 30B or the fourth polishing table 30D, and is re-polished for the calculated additional polishing time while the polishing liquid is supplied onto the polishing pad 10. If the measured film thickness has reached the target value, then the wafer is transported to the cleaning section 4, where the wafer is cleaned and dried (step 8). The film thickness measurement in the steps 4 and 5 and the comparison of the measured film thickness with the target value in the step 6 after the re-polishing of the wafer may be omitted.

Figure 20:
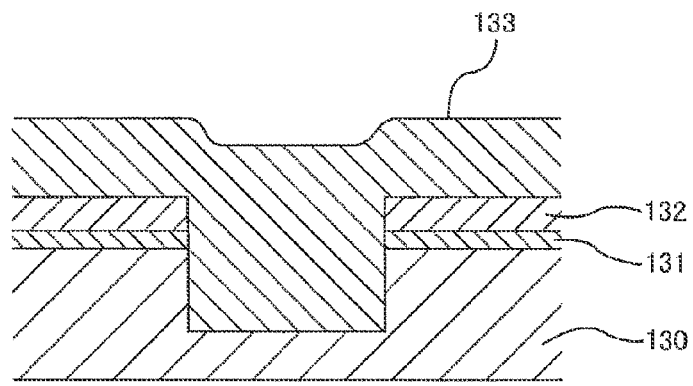
FIG. 20 is a cross-sectional view of a wafer showing a STI (shallow trench isolation) process.

FIG. 20 is a cross-sectional view of a wafer showing an STI (shallow trench isolation) process. The wafer shown in FIG. 20 has a multilayer structure constituted by a silicon substrate 130, an $SiO_2$ film 131 formed on the silicon substrate 130, a silicon nitride film 132 made of $Si_3N_4$ and formed on the $SiO_2$ film 131, and an element isolation dielectric film 133 (hereinafter simply referred to as dielectric film 133) made of $SiO_2$, formed by high-density plasma CVD or other technique, and formed on the silicon nitride film 132. STI trenches are formed in the stack of the silicon substrate 130, the $SiO_2$ film 131, and the silicon nitride film 132. The dielectric film 133 is partly embedded in the STI trenches.

Figure 21A:
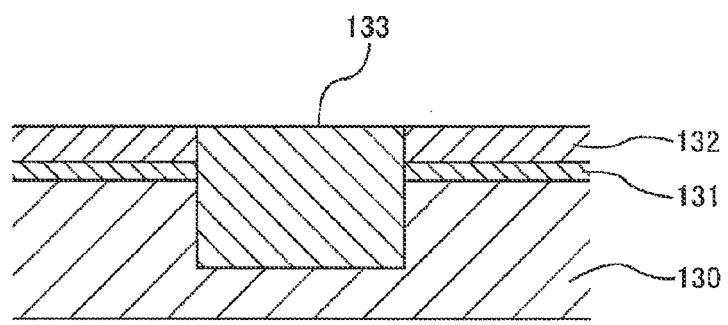
FIGS. 21A and 21B are diagrams showing the polishing method for the wafer shown in FIG. 20.
Figure 21B:
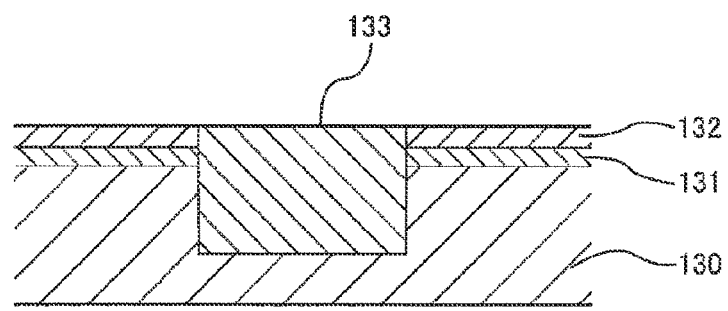

FIGS. 21A and 21B are diagrams illustrating an exemplary polishing method for the wafer shown in FIG. 20. The wafer having the above-described multilayer structure is polished in two steps in the first polishing unit 3A and the second polishing unit 3B while, at the same time, another wafer having the same construction is polished in two steps in the third polishing unit 3C and the fourth polishing unit 3D. As shown in FIG. 21A, the first step of the two-step polishing process is a process of removing the unnecessary portion of the dielectric film 133 to expose the silicon nitride film 132. As shown in FIG. 21B, the second step includes a process of polishing the dielectric film 133 and the silicon nitride film 132 in order to remove scratches formed on the surfaces of these films and a process of finally adjusting the thickness of the dielectric film 133. The first step of the two-step polishing process is carried out in the first polishing unit 3A and the third polishing unit 3C, and the second step is carried out in the second polishing unit 3B and the fourth polishing unit 3D.

FIG. 22 is a flowchart for illustrating the wafer polishing method shown in FIGS. 21A and 21B. In step 1, while the polishing liquid is supplied onto the polishing pad 10 on the first polishing table 30A or the third polishing table 30C, the dielectric film 133 is polished until the silicon nitride film 132 is exposed. This step 1 corresponds to the first polishing process shown in FIG. 21A. In step 2, while the polishing liquid is supplied onto the polishing pad 10 on the second polishing table 30B or the fourth polishing table 30D, the dielectric film 133 and the silicon nitride film 132 are polished until the thickness of the dielectric film 133 reaches a predetermined target value. This step 2 corresponds to the second polishing process shown in FIG. 21B.

In step 3, the wafer is water-polished while pure water, instead of the polishing liquid, is supplied onto the polishing pad 10 on the second polishing table 30B or the fourth polishing table 30D. This water polishing removes the polishing liquid and polishing debris from the wafer. In step 4, the polished wafer is transported to the wet-type film thickness measuring device 80.

In step 5, the thickness of the polished dielectric film 133 is measured by the wet-type film thickness measuring device 80. The measurement result of the film thickness is sent to the operation controller 5. In step 6, the operation controller 5 compares the measured current film thickness with the predetermined target value. If the measured film thickness has not reached the target value, then the operation controller 5 calculates an additional polishing time that is necessary to achieve the target value from a difference between the measured film thickness and the target value (step 7). The wafer is again transported to the polishing pad 10 on the second polishing table 30B or the fourth polishing table 30D, and is re-polished for the calculated additional polishing time while the polishing liquid is supplied onto the polishing pad 10. If the measured film thickness has reached the target value, then the wafer is transported to the cleaning section 4, where the wafer is cleaned and dried (step 8). The film thickness measurement in the steps 4 and 5 and the comparison of the measured film thickness with the target value in the step 6 after the re-polishing of the wafer may be omitted.

Figure 23:
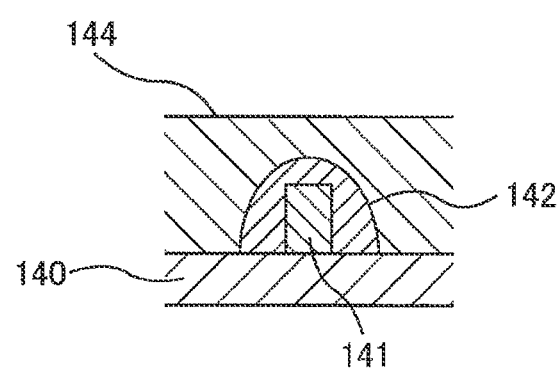
FIG. 23 is a cross-sectional view of a wafer having a multilayer structure to which CMP is applied in a process of forming high-k metal gate.

Polishing of a wafer having still another multilayer structure will be described. FIG. 23 is a cross-sectional view of a wafer having a multilayer structure to which CMP is applied in a process of forming a high-k metal gate. As shown in FIG. 23, the multilayer structure is constituted by a silicon substrate 140, polysilicon 141 formed on the silicon substrate 140, a side wall 142 made of silicon nitride (Si$_3$N$_4$) and covering the polysilicon 141, and a dielectric film 144 formed on the side wall 142.

Figure 24A:
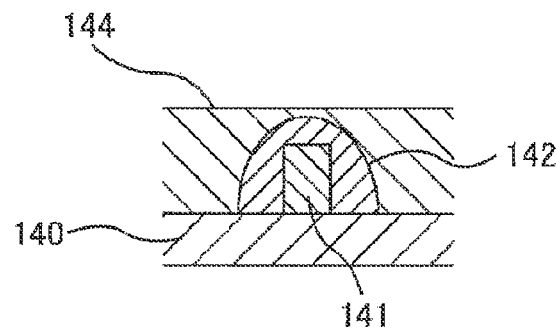
FIGS. 24A, 24B, 24C, and 24D are diagrams showing an example of the polishing method for the wafer shown in FIG. 23.
Figure 24B:
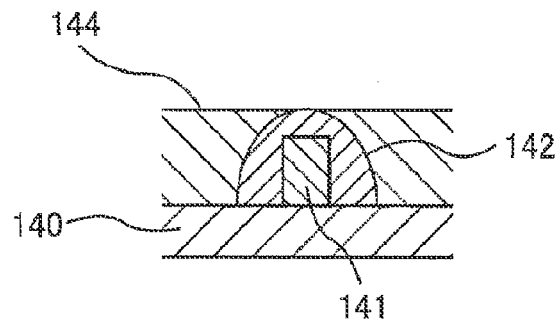
Figure 24C:
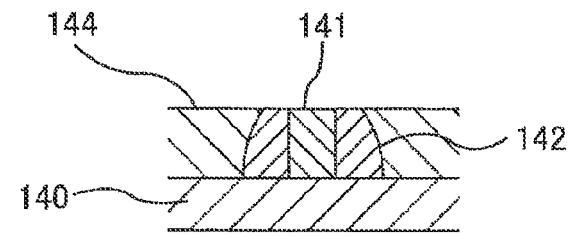
Figure 24D:
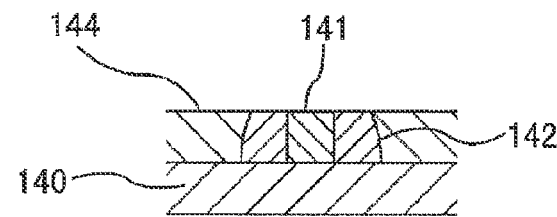

As shown in FIGS. 24A through 24D, the wafer is polished in four steps. The first polishing process is a process of polishing the dielectric film 144 until its thickness reaches a predetermined first target value as shown in FIG. 24A, the second polishing process is a process of polishing the dielectric film 144 until the side wall 142 is exposed and the thickness of the dielectric film 144 reaches a predetermined second target value as shown in FIG. 24B, the third polishing process is a process of polishing the dielectric film 144 and the side wall 142 until the polysilicon 141 is exposed and the thickness of the dielectric film 144 reaches a predetermined third target value as shown in FIG. 24C, and the fourth polishing process is a process of polishing the dielectric film 144, the polysilicon 141, and the side wall 142 until the thickness of the dielectric film 144 reaches a predetermined fourth target value as shown in FIG. 24D.

The first polishing process is performed in the first polishing unit 3A, the second polishing process is performed in the second polishing unit 3B, the third polishing process is performed in the third polishing unit 3C, and the fourth polishing process is performed in the fourth polishing unit 3D. During each polishing process, the film thickness signal of the dielectric film 144 is obtained by the optical film thickness sensor 40. Instead of the optical film thickness sensor 40, a set time or the torque current measuring device 70 may be used to determine the polishing end point. The operation controller 5 produces the film thickness index value or the removal index value of the dielectric film 144 from the film thickness signal and stops polishing of the dielectric film 144 when the film thickness index value or the removal index value reaches a predetermined threshold value (i.e., when the thickness of the dielectric film 144 or the removal amount of the dielectric film 144 reaches a predetermined target value).

Figure 25:
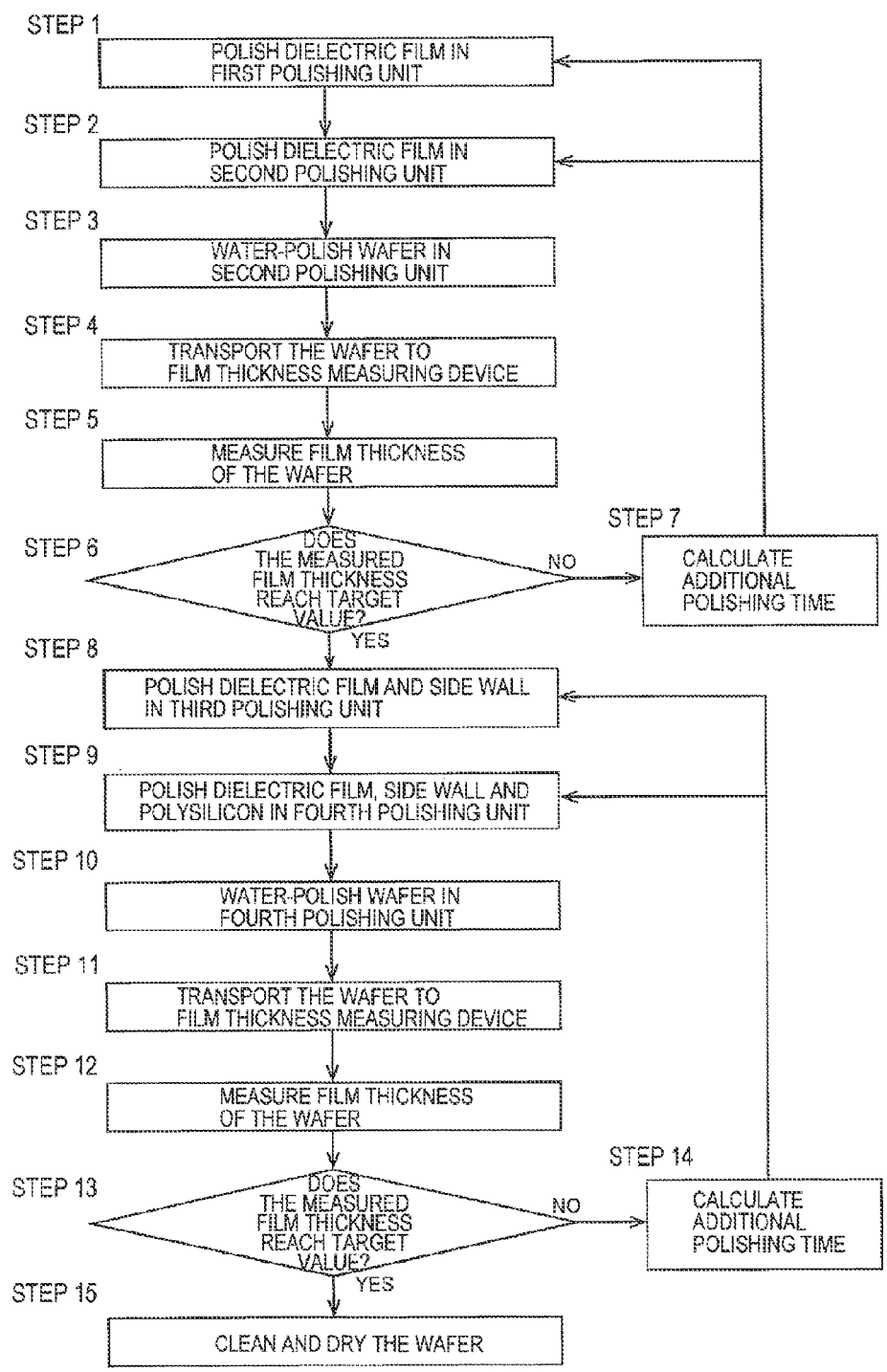
FIG. 25 is a flowchart for illustrating the polishing method shown in FIG. 24A through FIG. 24D.

FIG. 25 is a flowchart for illustrating the wafer polishing method shown in FIGS. 24A through 24D. In step 1, while the polishing liquid is supplied onto the polishing pad 10 on the first polishing table 30A, the dielectric film 144 is polished until its thickness reaches a predetermined first target value. This step 1 corresponds to the first polishing process shown in FIG. 24A. In step 2, while the polishing liquid is supplied onto the polishing pad 10 on the second polishing table 30B, the dielectric film 144 is polished until the side wall 142 is exposed and the thickness of the dielectric film 144 reaches a predetermined second target value. This step 2 corresponds to the second polishing process shown in FIG. 24B.

In step 3, the wafer is water-polished while pure water, instead of the polishing liquid, is supplied onto the polishing pad 10 on the second polishing table 30B. This water polishing removes the polishing liquid and polishing debris from the wafer. In step 4, the polished wafer is transported to the wet-type film thickness measuring device 80.

In step 5, the thickness of the polished dielectric film 144 is measured by the wet-type film thickness measuring device 80. The measurement result of the film thickness is sent to the operation controller 5. In step 6, the operation controller 5 compares the measured current film thickness with the predetermined second target value. If the measured film thickness has not reached the second target value, then the operation controller 5 calculates an additional polishing time that is necessary to achieve the second target value from a difference between the measured film thickness and the second target value (step 7). The wafer is again transported to the polishing pad 10 on the first polishing table 30A or the second polishing table 30B, and is re-polished for the calculated additional polishing time while the polishing liquid is supplied onto the polishing pad 10. The film thickness measurement in the steps 4 and 5 and the comparison of the measured film thickness with the target value in the step 6 after the re-polishing of the wafer may be omitted. To which either the first polishing table 30A or the second polishing table 30B the wafer is to be transported for re-polishing may be determined based on whether or not the side wall 142 is exposed or on whether or not the difference between the measured current film thickness of the dielectric film 144 and the predetermined second target value is within a predetermined range. If the measured film thickness has reached the target value, then the wafer is transported to the polishing pad 10 on the third polishing table 30C.

In step 8, while the polishing liquid is supplied onto the polishing pad 10 on the third polishing table 30C, the dielectric film 144 and the side wall 142 are polished until the thickness of the dielectric film 144 reaches a predetermined third target value. This step 8 corresponds to the third polishing process shown in FIG. 24C. In step 9, while the polishing liquid is supplied onto the polishing pad 10 on the fourth polishing table 30D, the dielectric film 144, the polysilicon 141, and the side wall 142 are polished until the thickness of the dielectric film 144 reaches a predetermined fourth target value. This step 9 corresponds to the fourth polishing process shown in FIG. 24D.

In step 10, the wafer is water-polished while pure water, instead of the polishing liquid, is supplied onto the polishing pad 10 on the fourth polishing table 30D. This water polishing removes the polishing liquid and polishing debris from the wafer. In step 11, the polished wafer is transported to the wet-type film thickness measuring device 80.

In step 12, the thickness of the polished dielectric film 144 is measured by the wet-type film thickness measuring device 80. The measurement result of the film thickness is sent to the operation controller 5. In step 13, the operation controller 5 compares the measured current film thickness with the predetermined fourth target value. If the measured film thickness has not reached the fourth target value, then the operation controller 5 calculates an additional polishing time that is necessary to achieve the fourth target value from a difference between the measured film thickness and the fourth target value (step 14). The wafer is again transported to the polishing pad 10 on the third polishing table 30C or the fourth polishing table 30D, and is re-polished for the calculated additional polishing time while the polishing liquid is supplied onto the polishing pad 10. The film thickness measurement in the steps 11 and 12 and the comparison of the measured film thickness with the target value in the step 13 after the re-polishing of the wafer may be omitted. To which either the third polishing table 30C or the fourth polishing table 30D the wafer is to be transported for re-polishing may be determined based on whether or not the polysilicon 141 is exposed or on whether or not the difference between the measured current film thickness of the dielectric film 144 and the predetermined fourth target value is within a predetermined range. If the measured film thickness has reached the fourth target value, then the wafer is transported to the cleaning section 4, where the wafer is cleaned and dried (step 15).

Figure 26:
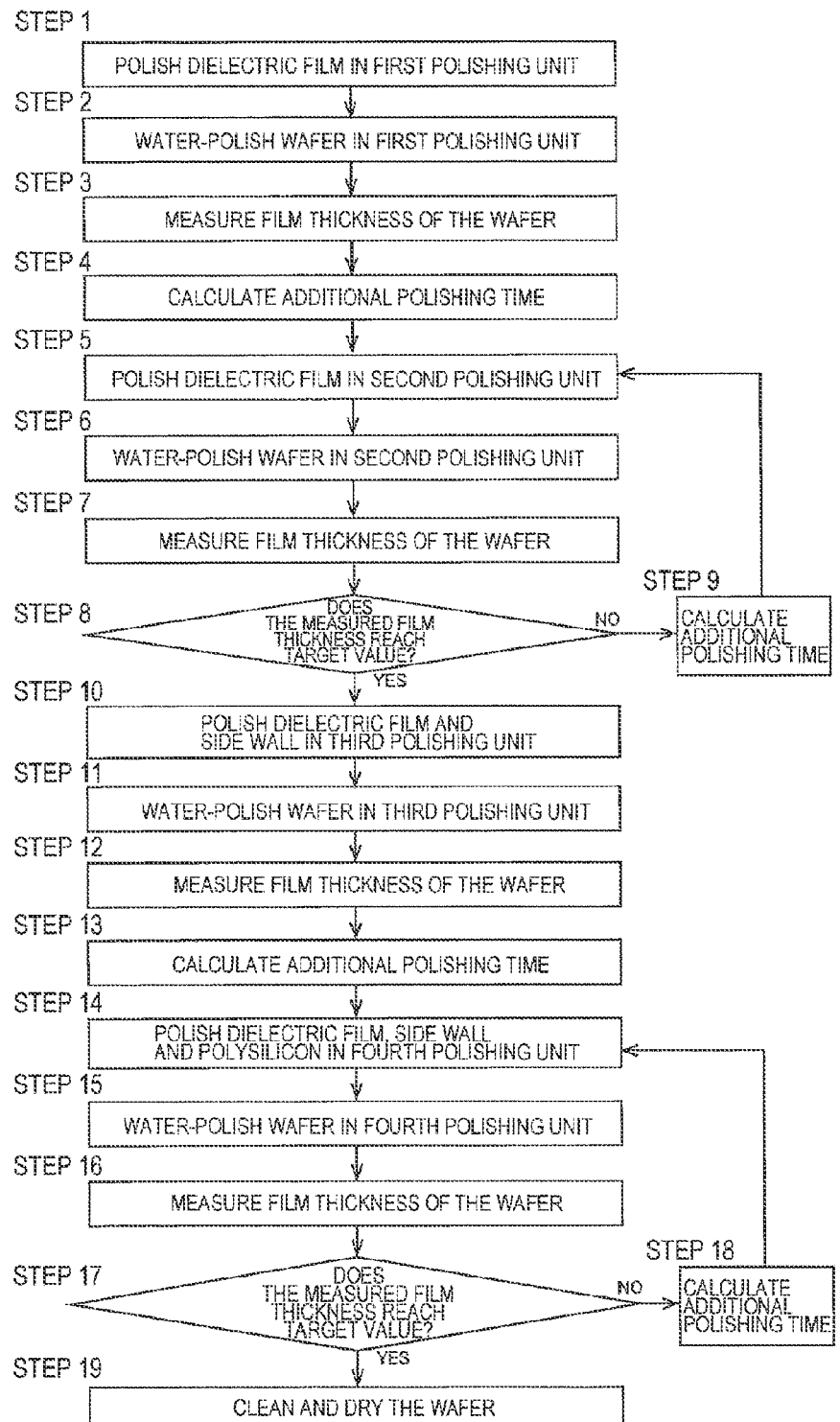
FIG. 26 is a flowchart for illustrating another example of the polishing method shown in FIG. 24A through FIG. 24D.

FIG. 26 is a flowchart of another example for carrying out the wafer polishing method illustrated in FIGS. 24A through 24D. In step 1, while the polishing liquid is supplied onto the polishing pad 10 on the first polishing table 30A, the dielectric film 144 is polished until its thickness reaches a predetermined first target value. This step 1 corresponds to the first polishing process shown in FIG. 24A. In step 2, the wafer is water-polished while pure water, instead of the polishing liquid, is supplied onto the polishing pad 10 on the first polishing table 30A. In step 3, the wafer is transported to the wet-type film thickness measuring device 80, where the thickness of the dielectric film 144 is measured. In step 4, the operation controller 5 calculates an additional polishing time that is necessary for the measured current film thickness to reach a predetermined second target value.

In step 5, the wafer is transported to the polishing pad 10 on the second polishing table 30B, and the dielectric film 144 is polished for the additional polishing time calculated in step 3 while the polishing liquid is supplied onto the polishing pad 10. This step 5 corresponds to the second polishing process shown in FIG. 24B. In step 6, the wafer is water-polished while pure water, instead of the polishing liquid, is supplied onto the polishing pad 10 on the second polishing table 30B.

In step 7, the wafer is again transported to the wet-type film thickness measuring device 80, where the thickness of the dielectric film 144 is measured. The measurement result of the film thickness is sent to the operation controller 5. In step 8, the operation controller 5 compares the measured current film thickness with the predetermined second target value. If the measured film thickness has not reached the second target value, then the operation controller 5 calculates an additional polishing time that is necessary to achieve the second target value from a difference between the measured film thickness and the second target value (step 9). The wafer is again transported to the polishing pad 10 on the second polishing table 30B, and is re-polished for the calculated additional polishing time while the polishing liquid is supplied onto the polishing pad 10. If the measured film thickness has reached the target value, then the wafer is transported to the polishing pad 10 on the third polishing table 30C. In the above-described step 5, the film thickness of the wafer is expected to reach the second target value by polishing the wafer for the additional polishing time calculated in the step 4. Therefore, the film thickness measurement in the step 7 and the comparison of the measured film thickness with the target value in the step 8 may be omitted.

In step 10, while the polishing liquid is supplied onto the polishing pad 10 on the third polishing table 30C, the dielectric film 144 and the side wall 142 are polished until the thickness of the dielectric film 144 reaches a predetermined third target value. This step 10 corresponds to the third polishing process shown in FIG. 24C. In step 11, the wafer is water-polished while pure water, instead of the polishing liquid, is supplied onto the polishing pad 10 on the third polishing table 30C. In step 12, the wafer is transported to the wet-type film thickness measuring device 80, where the thickness of the dielectric film 144 is measured. In step 13, the operation controller 5 calculates an additional polishing time that is necessary for the measured current film thickness to reach a predetermined fourth target value.

In step 14, the wafer is transported to the polishing pad 10 on the fourth polishing table 30D, and the dielectric film 144, the side wall 142, and the polysilicon 141 are polished for the additional polishing time calculated in the step 13 while the polishing liquid is supplied onto the polishing pad 10 on the fourth polishing table 30D. This step 14 corresponds to the fourth polishing process shown in FIG. 24D. In step 15, the wafer is water-polished while pure water, instead of the polishing liquid, is supplied onto the polishing pad 10 on the fourth polishing table 30D.

In step 16, the wafer is transported to the wet-type film thickness measuring device 80, where the thickness of the dielectric film 144 is measured. The measurement result of the film thickness is sent to the operation controller 5. In step 17, the operation controller 5 compares the measured current film thickness with the predetermined fourth target value. If the measured film thickness has not reached the fourth target value, then the operation controller 5 calculates an additional polishing time that is necessary to achieve the fourth target value from a difference between the measured film thickness and the fourth target value (step 18). The wafer is again transported to the polishing pad 10 on the fourth polishing table 30D, and is re-polished for the calculated additional polishing time while the polishing liquid is supplied onto the polishing pad 10. If the measured film thickness has reached the target value, then the wafer is transported to the cleaning section 4, where the wafer is cleaned and dried (step 19). In the above-described step 14, the film thickness of the wafer is expected to reach the fourth target value by polishing the wafer for the additional polishing time calculated in the step 13. Therefore, the film thickness measurement in the step 16 and the comparison of the measured film thickness with the target value in the step 17 may be omitted.

In the above-discussed embodiments, the film thickness measurement and the re-polishing process are performed prior to cleaning and drying of the wafer. Therefore, a time required for starting re-polishing of the wafer can be shortened. As a result, a throughput can be improved. Moreover, since the film thickness measurement is performed right after polishing of the wafer, the polishing conditions (e.g., polishing time and polishing pressure) adjusted based on the film-thickness measurement result can be applied to polishing of the next substrate immediately. Therefore, there is no need to keep the next wafer waiting for being processed, and hence the throughput can be improved. In addition, since the optimized polishing conditions can be applied to the subsequent wafers, a polishing accuracy can be improved.

In the case where the optical film thickness measuring sensor 60 is used for detecting the polishing end point, it is possible to carry out a calibration of the optical film thickness measuring sensor 60 with use of the measured value of the film thickness obtained by the wet-type film thickness measuring device 80. After the optical film thickness measuring sensor 60 is calibrated, the film thickness index value or the removal index value, both of which are obtained from the film thickness signal of the optical film thickness measuring sensor 60, has a correlation with the measured value of the film thickness obtained by the wet-type film thickness measuring device 80. Therefore, it is possible to maintain the polishing accuracy even if the film thickness measurement in the wet-type film thickness measuring device 80 is omitted.

Specifically, highly-accurate polishing of the wafer can be realized by: polishing the wafer while measuring the film thickness with the optical film thickness measuring sensor 60; terminating polishing of the wafer when the measured value of the current film thickness, obtained from the optical film thickness measuring sensor 60, reaches a predetermined value; transporting the polished wafer to the wet-type film thickness measuring device 80 before cleaning and drying the wafer; measuring the current film thickness by the wet-type film thickness measuring device 80; calibrating the optical film thickness measuring sensor 60 based on a comparison between the measured value of the current film thickness obtained by the optical film thickness measuring sensor 60 and the measured value of the current film thickness obtained by the wet-type film thickness measuring device 80; polishing a subsequent wafer having the same structure; measuring the film thickness of the subsequent wafer by the calibrated optical film thickness measuring sensor 60 during polishing of the subsequent wafer; and terminating polishing of the subsequent wafer when the film thickness obtained from the optical film thickness measuring sensor 60 reaches a predetermined target value.

According to this polishing method, the optical film thickness measuring sensor 60 is calibrated using the measured value of the film thickness obtained by the wet-type film thickness measuring device 80 that can carry out highly-accurate film measurement. Therefore, an accuracy of in-situ film thickness measurement that is performed during polishing of the subsequent wafer can be improved. As a result, re-polishing of the wafer can be eliminated. Moreover, the polishing conditions (including polishing time and polishing pressure) that have been adjusted based on the measurement result of the film thickness can be applied to polishing of the next wafer. Therefore, the throughput can be improved.

Figure 27:
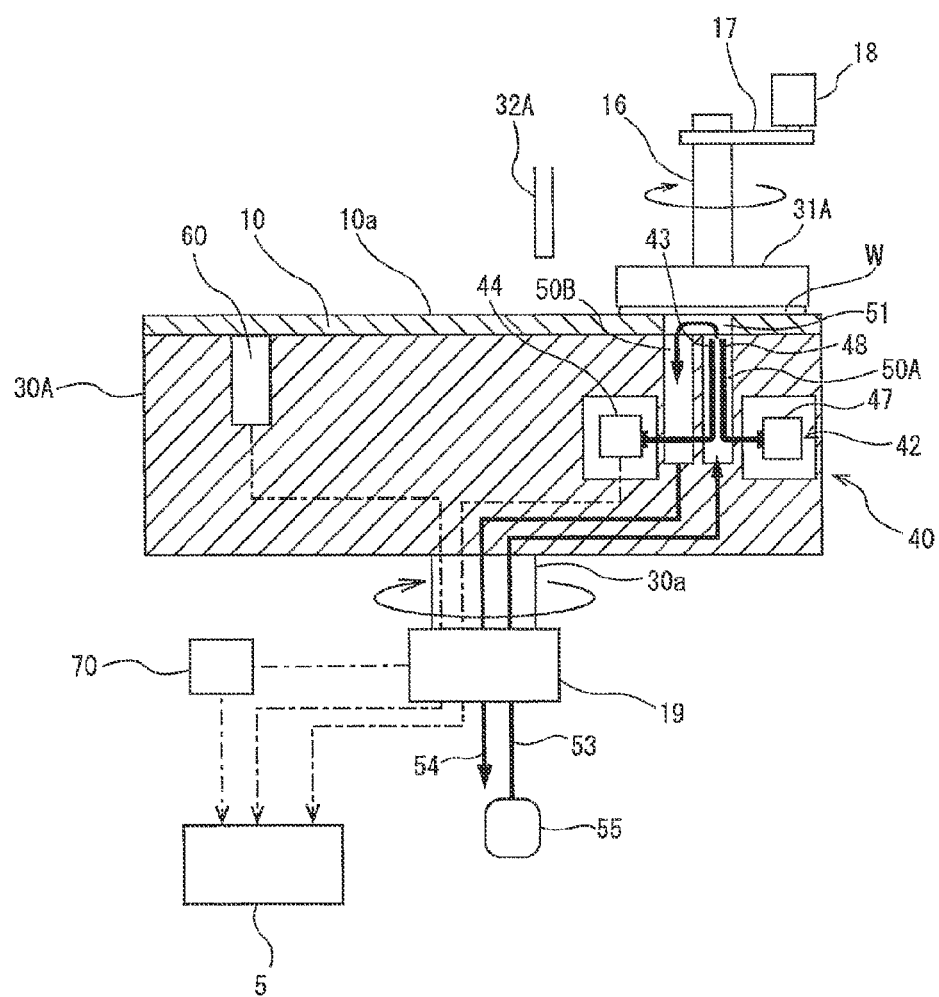
FIG. 27 is a schematic cross-sectional view showing a first polishing unit having an eddy current film thickness sensor and an optical film thickness sensor.

Next, the eddy current film thickness sensor 40 and the optical film thickness sensor 60 will be described. FIG. 27 is a schematic cross-sectional view showing the first polishing unit 3A having the eddy current film thickness sensor and the optical film thickness sensor. The polishing units 3B to 3D have the same structure as that of the first polishing unit 3A shown in FIG. 27 and their repetitive descriptions are omitted.

The optical film thickness sensor 40 and the optical film thickness sensor 60 are disposed in the polishing table 30A and are rotated together with the polishing table 30A and the polishing pad 10. The top ring shaft 16 is coupled to a top ring motor 18 through a coupling device, such as belt, so that the top ring shaft 16 is rotated by the top ring motor 18. This rotation of the top ring shaft 16 rotates the top ring 31A in the direction as indicated by arrow.

The optical film thickness sensor 40 is configured to irradiate the surface of the wafer W with light, receive the light reflected from the wafer W, and break up the reflected light according to wavelength. The optical film thickness sensor 40 includes an irradiator 42 for irradiating the surface, to be polished, of the wafer W with the light, an optical fiber 43 as an optical receiver for receiving the reflected light from the wafer W, and a spectrometer 44 configured to resolve the reflected light according to the wavelength and measure intensity of the reflected light over a predetermined wavelength range.

The polishing table 30A has a first hole 50A and a second hole 50B having upper open ends lying in the upper surface of the polishing table 30A. The polishing pad 10 has a through-hole 51 at a position corresponding to the holes 50A and 50B. The holes 50A and 50B are in fluid communication with the through-hole 51, which has an upper open end lying in the polishing surface 10a. The first hole 50A is coupled to a liquid supply source 55 via a liquid supply passage 53 and a rotary joint (not shown). The second hole 50B is coupled to a liquid discharge passage 54.

The irradiator 42 includes a light source 47 for emitting multiwavelength light and an optical fiber 48 coupled to the light source 47. The optical fiber 48 is an optical transmission element for directing the light, emitted by the light source 47, to the surface of the wafer W. Tip ends of the optical fiber 48 and the optical fiber 43 lie in the first hole 50A and are located near the surface, to be polished, of the wafer W. The tip ends of the optical fiber 48 and the optical fiber 43 are arranged so as to face the wafer W held by the top ring 31A, so that multiple zones of the wafer W are irradiated with the light each time the polishing table 30A makes one revolution. Preferably, the tip ends of the optical fiber 48 and the optical fiber 43 are arranged so as to face the center of the wafer W held by the top ring 31A.

During polishing of the wafer W, the liquid supply source 55 supplies water (preferably pure water) as a transparent liquid into the first hole 50A through the liquid supply passage 53. The water fills a space formed between the lower surface of the wafer W and the tip ends of the optical fibers 48 and 43. The water further flows into the second hole 50B and is expelled therefrom through the liquid discharge passage 54. The polishing liquid is discharged together with the water and thus a path of light is secured. The liquid supply passage 53 is provided with a valve (not shown in the drawing) configured to operate in conjunction with the rotation of the polishing table 30A. The valve operates so as to stop the flow of the water or reduce the flow of the water when the wafer W is not located over the through-hole 51.

The optical fiber 48 and the optical fiber 43 are arranged in parallel with each other. The tip ends of the optical fiber 48 and the optical fiber 43 are substantially perpendicular to the surface of the wafer W, so that the optical fiber 48 directs the light to the surface of the wafer W perpendicularly.

During polishing of the wafer W, the irradiator 42 irradiates the wafer W with the light, and the optical fiber (optical receiver) 43 receives the light reflected from the wafer W. The spectrometer 44 measures the intensity of the reflected light at each of the wavelengths over the predetermined wavelength range and sends light intensity data to the operation controller 5. This light intensity data is the film thickness signal reflecting the film thickness of the wafer W and varying in accordance with the film thickness of the wafer W. The operation controller 5 produces a spectrum showing the light intensities at the respective wavelengths from the light intensity data, and further produces the film thickness index value representing the film thickness of the wafer W from the spectrum.

Figure 28:
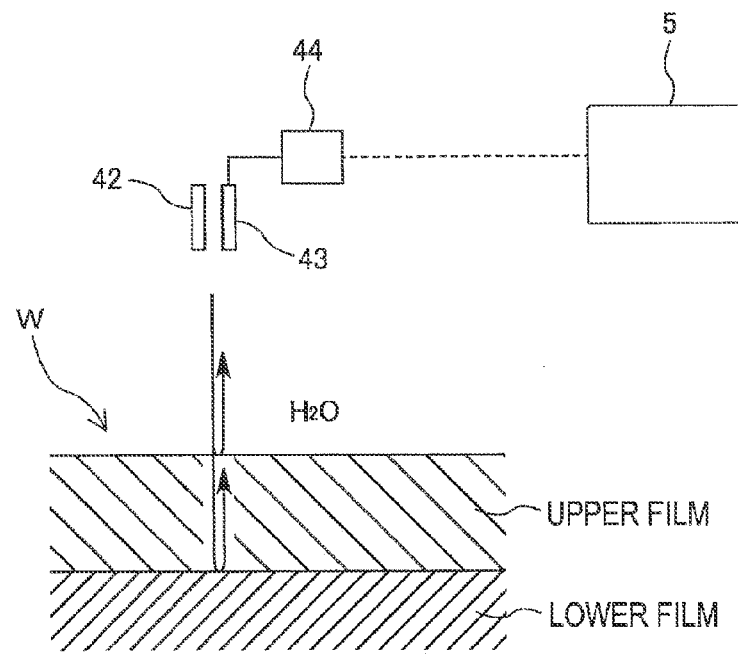
FIG. 28 is a schematic view illustrating a principle of the optical film thickness sensor.
Figure 29:
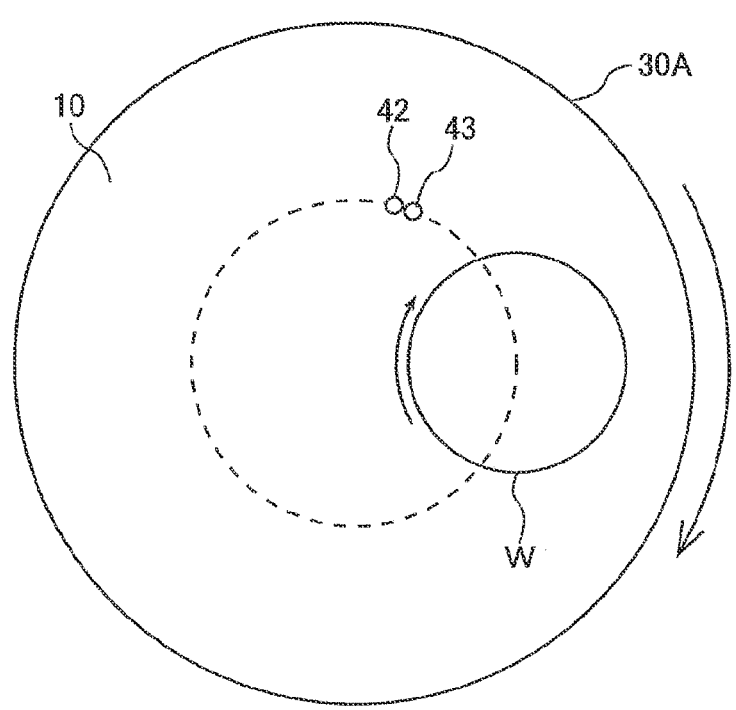
FIG. 29 is a plan view showing a positional relationship between the wafer and a polishing table.

FIG. 28 is a schematic view illustrating the principle of the optical film thickness sensor 40, and FIG. 29 is a plan view showing a positional relationship between the wafer W and the polishing table 30A. In this example shown in FIG. 28, the wafer W has a lower film and an upper film formed on the lower film. The irradiator 42 and the optical receiver 43 are oriented toward the surface of the wafer W. The irradiator 42 is configured to irradiate the multiple zones, including the center of the wafer W, on the surface of the wafer W with the light each time the polishing table 30A makes one revolution.

The light, directed to the wafer W, is reflected off an interface between a medium (e.g., water in the example of FIG. 28) and the upper film and an interface between the upper film and the lower film. Light waves from these interfaces interfere with each other. The manner of interference between the light waves varies according to the thickness of the upper film (i.e., a length of an optical path). As a result, the spectrum, produced from the reflected light from the wafer, varies according to the thickness of the upper film. The spectrometer 44 breaks up the reflected light according to the wavelength and measures the intensity of the reflected light at each of the wavelengths. The operation controller 5 produces the spectrum from the light intensity data (the film thickness signal) obtained from the spectrometer 44. This spectrum is expressed as a line graph (i.e., a spectral waveform) indicating a relationship between the wavelength and the intensity of the light. The intensity of the light can also be expressed as a relative value, such as a reflectance or a relative reflectance.

Figure 30:
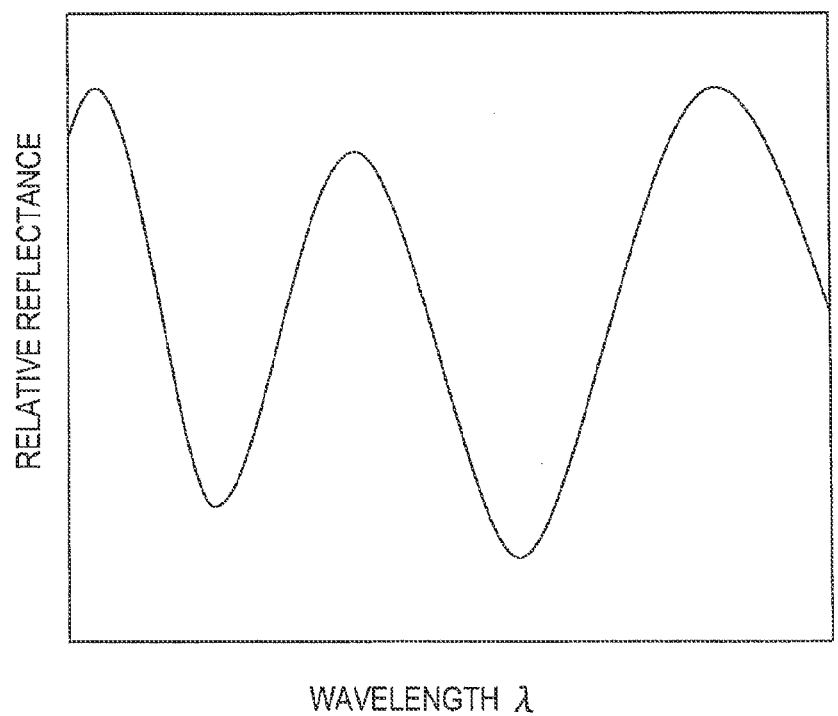
FIG. 30 is a diagram showing a spectrum created by an operation controller.
Figure 31:
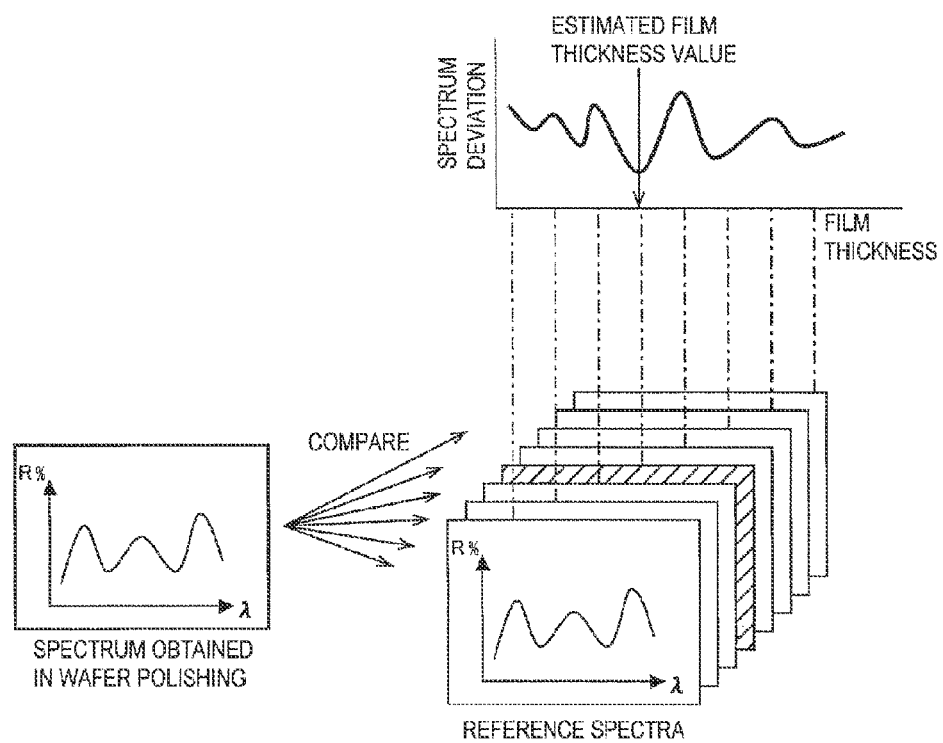
FIG. 31 is a diagram illustrating a process of determining a current film thickness from a comparison of the created spectrum with a plurality of reference spectra.

FIG. 30 is a diagram showing the spectrum created by the operation controller 5. In FIG. 30, horizontal axis represents the wavelength of the reflected light, and vertical axis represents relative reflectance derived from the intensity of the light. The relative reflectance is an index that represents the intensity of the reflected light. More specifically, the relative reflectance is a ratio of the intensity of the reflected light to predetermined reference intensity. By dividing the intensity of the light (i.e., the actually measured intensity) by the corresponding reference intensity at each of the wavelengths, unwanted noises, such as a variation in the intensity inherent in an optical system or the light source, are removed from the actually measured intensity. As a result, the spectrum reflecting only the thickness information of the upper film can be obtained.

The predetermined reference intensity may be intensity of the reflected light obtained when a silicon wafer (bare wafer) with no film thereon is being polished in the presence of water. In the actual polishing process, the relative reflectance is obtained as follows. A dark level (which is a background intensity obtained under the condition that the light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. That is, the relative reflectance $R(\lambda)$ can be calculated by using the following equation (1).

$$R(\lambda) = \frac{E(\lambda) - D(\lambda)}{B(\lambda) - D(\lambda)} \tag{1}$$

where $\lambda$ is wavelength, $E(\lambda)$ is the intensity of the reflected light at the wavelength $\lambda$, $B(\lambda)$ is the reference intensity at the wavelength $\lambda$, and $D(\lambda)$ is the dark level at the wavelength $\lambda$ (i.e., the intensity of the light obtained under the condition that the light is cut off).

The operation controller 5 compares the spectrum, which is produced during polishing of the wafer, with a plurality of reference spectra so as to determine a reference spectrum that is most similar to the spectrum produced. A film thickness associated with the determined reference spectrum is determined to be a current film thickness by the operation controller 5. The plurality of reference spectra are those obtained in advance by polishing a wafer of the same type as the wafer to be polished. Each reference spectrum is associated with a film thickness at a point of time when that reference spectrum is obtained. Specifically, each reference spectrum is obtained at different film thickness, and the plurality of reference spectra correspond to different film thicknesses. Therefore, the current film thickness can be estimated by determining the reference spectrum that is most similar to the current spectrum. This estimated film thickness is the above-mentioned film thickness index value.

The optical film thickness sensor 40 is suitable for use in determining the thickness of the dielectric film having a property that allows light to pass therethrough. The operation controller 5 may determine the removal amount of the film from the film thickness index value (or the light intensity data) obtained by the optical film thickness sensor 40. More specifically, an initial estimated film thickness is determined from the initial film thickness index value (or initial light intensity data) in accordance with the above-described method, and the removal amount is determined by subtracting the current estimated film thickness from the initial estimated film thickness.

Figure 32:
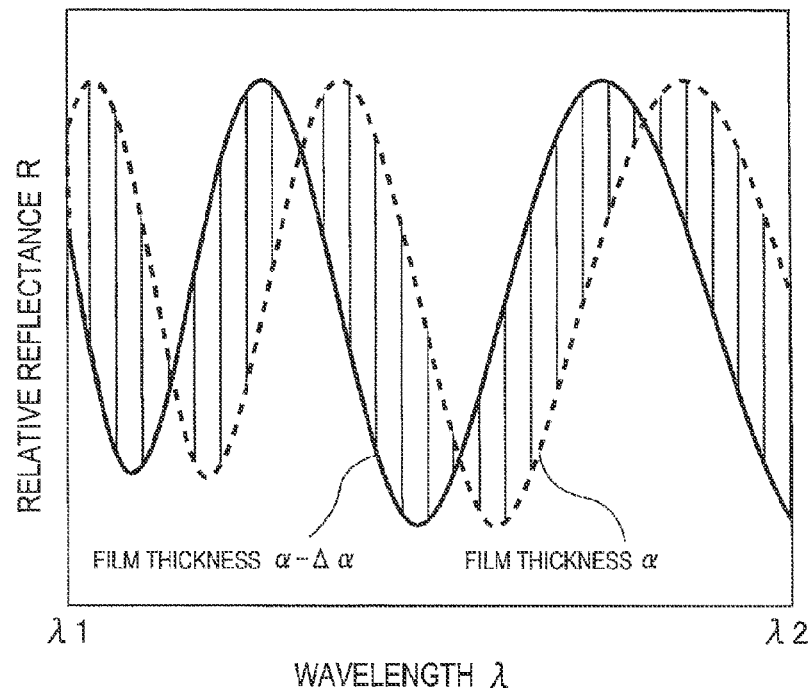
FIG. 32 is a schematic view showing two spectra corresponding to a film thickness difference $\Delta\alpha$.

Instead of the above-described method, the removal amount of the film may be determined from an amount of change in the spectrum that varies in accordance with the film thickness. FIG. 32 is a schematic view showing two spectra corresponding to a film thickness difference $\Delta\alpha$. In FIG. 32, $\alpha$ represents the film thickness. This film thickness $\alpha$ decreases with time during polishing of the wafer ($\Delta\alpha$>0). As shown in FIG. 32, as the film thickness changes, the spectrum moves along a wavelength axis. The amount of change between the two spectra obtained at two different times corresponds to a region (shown by hatching) surrounded by these spectra. Therefore, the removal amount of the film can be determined by calculating the area of this region. The removal amount U of the film is determined using the following equation (2).

$$U = \sum_{\lambda 1}^{\lambda 2} |Rc(\lambda) - Rp(\lambda)| \tag{2}$$

where $\lambda$ is wavelength of the light, $\lambda 1$ and $\lambda 2$ are minimum wavelength and maximum wavelength that determine the wavelength range of the spectrum to be monitored, Rc is currently obtained relative reflectance, and Rp is previously obtained relative reflectance. The amount of change in the spectrum calculated by the equation (2) is the removal index value indicating the removal amount of the film.

Figure 33:
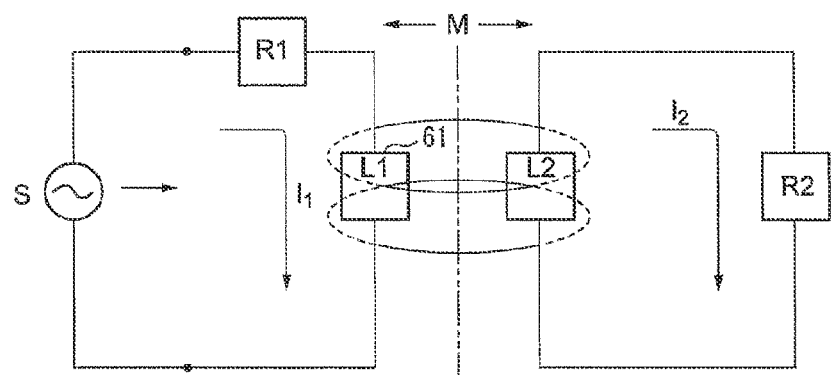
FIG. 33 is a diagram illustrating a principle of an eddy current film thickness sensor.

Next, the eddy current film thickness sensor 60 will be described. The eddy current film thickness sensor 60 is configured to pass a high-frequency alternating current to a coil so as to induce the eddy current in a conductive film and detect the thickness of the conductive film from the change in the impedance due to a magnetic field produced by the induced eddy current. FIG. 33 is a diagram showing a circuit for illustrating the principle of the eddy current film thickness sensor 60. When an AC power supply S (a voltage E [V]) passes a high-frequency alternating current $I_1$ to a coil 61, magnetic lines of force, induced in the coil 61, pass through the conductive film. As a result, mutual inductance occurs between a sensor-side circuit and a conductive-film-side circuit, and an eddy current $I_2$ flows in the conductive film. This eddy current $I_2$ generates magnetic lines of force, which cause a change in an impedance of the sensor-side circuit. The eddy current film thickness sensor 60 measures the thickness of the conductive film from the change in the impedance of the sensor-side circuit.

In the sensor-side circuit and the conductive-film-side circuit in FIG. 33, the following equations hold.

$$R_1 I_1 + L_1 dI_1/dt + M dI_2/dt = E \tag{3}$$

$$R_2 I_2 + L_2 dI_2/dt + M dI_1/dt = 0 \tag{4}$$

where M represents mutual inductance, $R_1$ represents equivalent resistance of the sensor-side circuit including the coil Q, $L_1$ represents self-inductance of the sensor-side circuit including the coil Q, $R_2$ represents equivalent resistance of the conductive film in which the eddy current is induced, and $L_2$ represents self-inductance of the conductive film through which the eddy current flows.

Letting $I_n = A_n e^{j\omega t}$ (sine wave), the above equations (3) and (4) are expressed as follows.

$$(R_1 + j\omega L_1)I_1 + j\omega M I_2 = E \tag{5}$$

$$(R_2 + j\omega L_2)I_2 + j\omega M I_1 = 0 \tag{6}$$

From these equations (5) and (6), the following equations are derived.

$$I_1 = E(R_2 + j\omega L_2)/[(R_1 + j\omega L_1)(R_2 + j\omega L_2) + \omega^2 M^2] \tag{7}$$

$$= E/[(R_1 + j\omega L_1) + \omega^2 M^2/(R_2 + j\omega L_2)]$$

Thus, the impedance $\Phi$ of the sensor-side circuit is given by the following equation.

$$\Phi = E/I_1 \qquad (8)$$
$$= [R_1 + \omega^2 M^2 R_2/(R_2^2 + \omega^2 L_2^2)] +$$
$$j\omega[L_1 - \omega^2 L_2 M^2/(R_2^2 + \omega^2 L_2^2)]$$

Substituting X and Y for a real part (i.e., a resistance component) and an imaginary part (i.e., an inductive reactance component) respectively, the above equation (8) is expressed as follows.

$$\Phi = X + j\omega Y \qquad (9)$$

The eddy current film thickness sensor 60 outputs the resistance component X and the inductive reactance component Y of the impedance of the electric circuit including the coil 61 of the eddy current film thickness sensor 60. These resistance component X and the inductive reactance component Y are the film thickness signal reflecting the film thickness and vary in accordance with the film thickness of the wafer.

Figure 34:
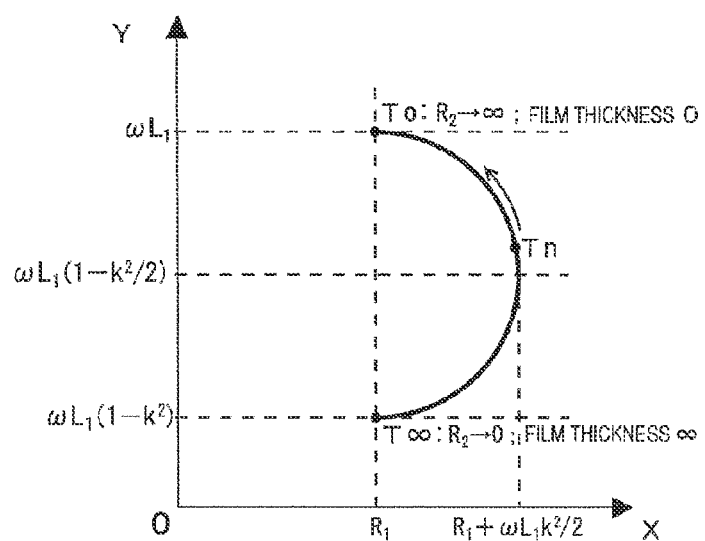
FIG. 34 is a diagram showing a graph drawn by plotting coordinates X and Y, which change with a film thickness, on a XY coordinate system.

FIG. 34 is a diagram showing a graph drawn by plotting X and Y, which change with the film thickness, on a XY coordinate system. Coordinates of a point T∞ are values of X and Y when the film thickness is infinity, i.e., $R_2$ is zero. Where electrical conductivity of a substrate can be neglected, coordinates of a point T0 are values of X and Y when the film thickness is zero, i.e., $R_2$ is infinity. A point Tn, specified by the values of X and Y, moves in a circular arc toward the point TO as the film thickness decreases. A symbol k in FIG. 34 represents coupling coefficient, and the following relationship holds.

$$M = k(L_1 L_2)^{1/2} \qquad (10)$$

Figure 35:
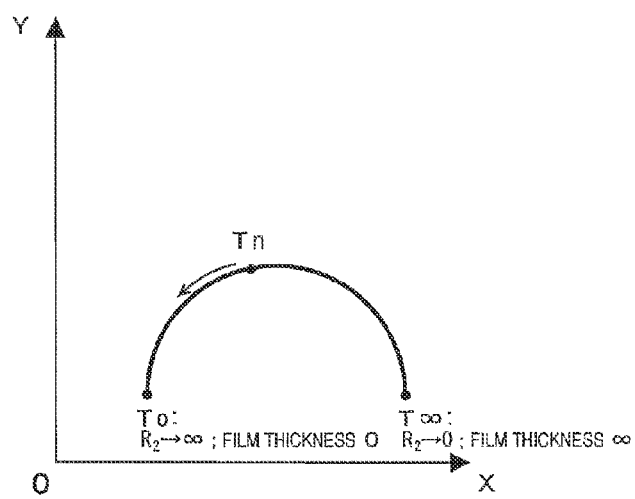
FIG. 35 shows a graph obtained by rotating the graph in FIG. 34 through 90 degrees in a counterclockwise direction and further translating the resulting graph.

FIG. 35 shows a graph obtained by rotating the graph in FIG. 34 through 90 degrees in a counterclockwise direction and further translating the resulting graph. As shown in FIG. 35, the point Tn, which is specified by the values of X and Y, travels in a circular arc toward the point T0 as the film thickness decreases.

Figure 36:
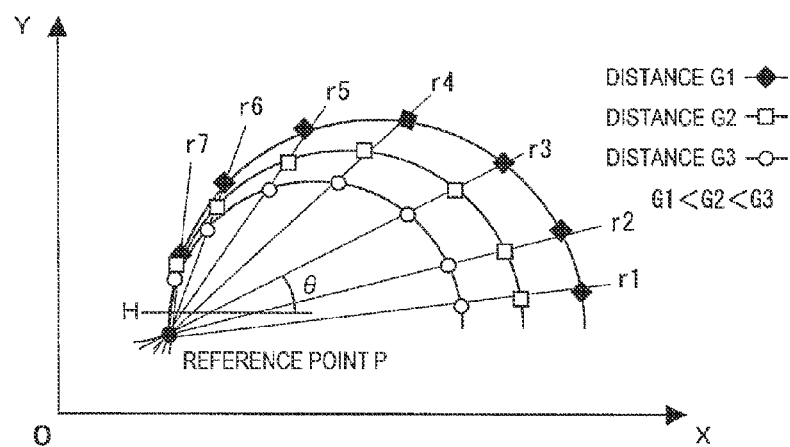
FIG. 36 is a graph showing arcuate paths of the coordinates X and Y that change in accordance with a distance between a coil and a wafer.

A distance between the coil 61 and the wafer W changes in accordance with a thickness of the polishing pad 10 that exists between the coil 61 and the wafer W. As a result, as shown in FIG. 36, the arcuate path of the coordinates X, Y changes in accordance with the distance G (G1 to G3) corresponding to the thickness of the polishing pad 10. As shown in FIG. 36, when points specified by the components X and Y at the same thickness of the conductive film are connected by lines (which will be referred to as preliminary measurement lines) with different distances G between the sensor coil 61 and the wafer W, these preliminary measurement lines ($r_1$, $r_2$, $r_3$, ...) intersect each other at an intersection (a reference point) P. Each of these preliminary measurement lines m (n=1, 2, 3 ...) is inclined at an elevation angle (included angle) θ with respect to a predetermined reference line (e.g., a horizontal line H in FIG. 36). This elevation angle θ varies depending on the thickness of the conductive film. Therefore, the angle θ is the film thickness index value indicating the film thickness of the wafer W.

Figure 37:
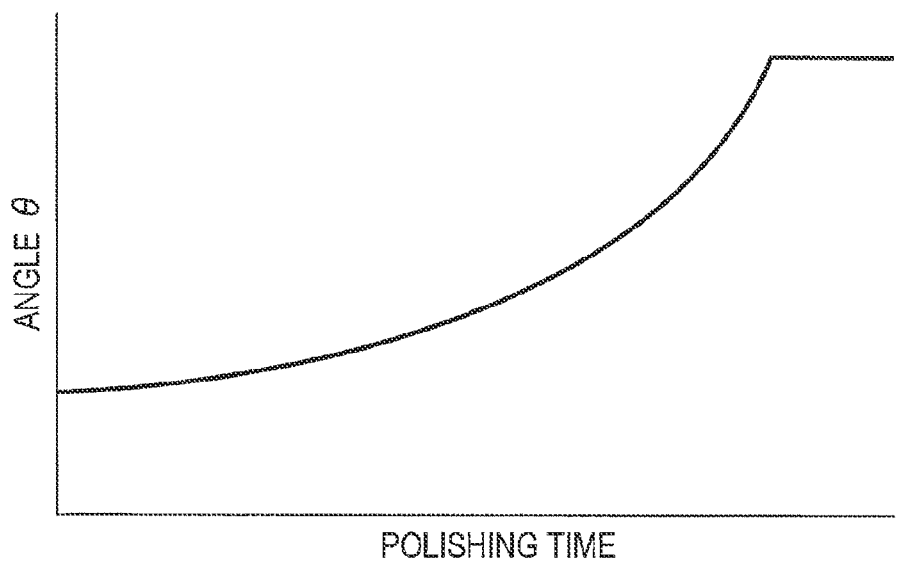
FIG. 37 is a graph showing an angle $\theta$ that varies in accordance with polishing time.

During polishing of the wafer W, the operation controller 5 can determine the film thickness from the angle θ with reference to correlation data showing a relationship between the angle θ and the film thickness. This correlation data is obtained in advance by polishing the same type of wafer as the wafer W to be polished and measuring the film thickness corresponding to each angle θ. FIG. 37 is a graph showing the angle θ that varies with the polishing time. Vertical axis represents the angle θ, and horizontal axis represents the polishing time. As shown in this graph, the angle θ increases with the polishing time, and becomes constant at a certain point of time. The operation controller 5 calculates the angle θ during polishing and determines the current film thickness from the angle θ.

The above-described optical film thickness sensor 40 and the eddy current film thickness sensor 60 may be a known optical sensor and a known eddy current sensor as disclosed in Japanese laid-open patent publications No. 2004-154928 and No. 2009-99842.

As shown in FIG. 4, in addition to the optical film thickness sensor 40 and the eddy current film thickness sensor 60, the torque current measuring device 70 is provided for measuring the input current (i.e., the torque current) of the table motor 19 that rotates the polishing table 30A. The value of the torque current measured by the torque current measuring device 70 is sent to the operation controller 5, which monitors the value of the torque current during polishing of the wafer W. Instead of providing the torque current measuring device 70, a current value outputted from an inverter (now shown) for driving the table motor 19 may be used for monitoring the torque current.

Figure 38:
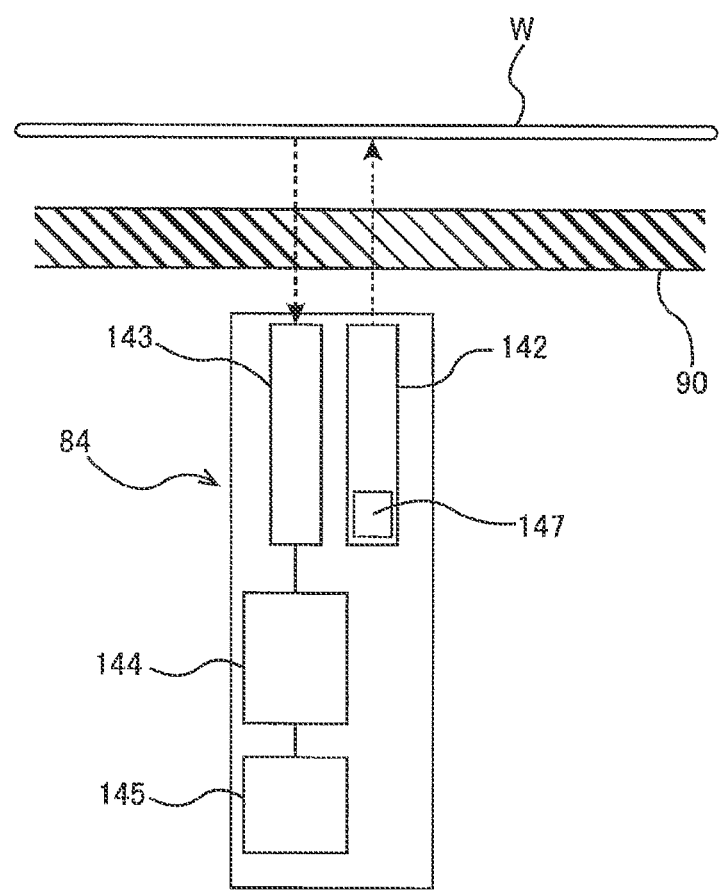
FIG. 38 is a schematic view showing details of an optical film thickness measuring head of a wet-type film thickness measuring device.

The principle of the film thickness measurement carried out by the wet-type film thickness measuring device 80 shown in FIG. 6 is the same as that of the above-discussed optical film thickness measuring sensor 60, and its duplicative descriptions are omitted. FIG. 38 is a schematic view showing details of an optical film thickness measuring head 42 of the wet-type film thickness measuring device 80. As shown in FIG. 38, the optical film thickness measuring head 42 includes an irradiator 142 configured to irradiate the surface of the wafer W with light, an optical receiver 143 configured to receive the light reflected from the wafer W, a spectrometer 144 configured to break up the reflected light according to wavelength and measure intensity of the reflected light over a predetermined wavelength range, and a processor 150 configured to produce a spectrum from light intensity data (film thickness signal) obtained from the spectrometer 144 and determine a film thickness based on the spectrum.

The irradiator 142 includes a light source 147 for emitting multiwavelength light. The irradiator 142 and the optical receiver 143 are located adjacent to the transparent window 90 and oriented toward the wafer W held by the holding device 82 (see FIG. 6A and FIG. 6B). Preferably, the irradiator 142 and the optical receiver 143 are oriented toward the center of the wafer W held by the holding device 82.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:
1. A method of polishing a substrate having a film on a surface of the substrate for semiconductor manufacturing, the method comprising:
   providing a polishing apparatus including
   (i) a polishing section including
   a rotatable polishing table for supporting a polishing pad, a rotatable top ring for holding and pressing the substrate against the polishing pad, a nozzle for supplying a polishing liquid onto a surface of the polishing pad, a first sensor embedded and fixed in the rotatable polishing table for measuring a thickness of the film of the substrate during polishing of a surface of the film with the polishing liquid, (ii) a cleaning and drying section for cleaning and drying the polished surface of the film on the substrate, and (iii) a measuring section having a second sensor for measuring the thickness of the polished film on the substrate wherein the second sensor is movable relatively to the substrate to measure thicknesses at desired multiple positions of the polished film on the substrate;

holding the substrate on the top ring;

rotating the polishing table with the polishing pad while rotating the top ring with the substrate;

polishing the film on the substrate by pressing the substrate against the polishing pad in the polishing section;

measuring a thickness of the film of the substrate that is rotating with the top ring by the first sensor that is rotating with the polishing table during polishing;

terminating the polishing when a measured thickness of the film by the first sensor is within a predetermined first value;

transporting the polished substrate to the measuring section;

measuring the thickness of the polished film by the second sensor at desired multiple positions;

creating a polishing profile of the substrate based on the thickness measured by the second sensor;

comparing the measured thickness with a predetermined second value; and re-polishing the substrate in the polishing section prior to cleaning the substrate in the cleaning and drying section if the measured thickness obtained by the second sensor is not within the predetermined second value, wherein a polishing condition for re-polishing the substrate is adjusted based on the polishing profile.

2. The method according to claim 1, further comprising:

calculating an additional polishing time period required based on the measured thickness by the second sensor, wherein the step of the re-polishing is re-polishing the substrate based on the calculated additional polishing time period.

3. The method according to claim 1 wherein the step of terminating the polishing is terminating the polishing shortly before the measured thickness of the film will reach the predetermined first value.

4. The method according to claim 1, wherein the polishing section includes a plurality of top rings and a plurality of polishing tables, and the step of the re-polishing is performed with the polishing table used in the step of the polishing.

5. The method according to claim 1, wherein the polishing section includes a plurality of top rings and a plurality of polishing tables, and the step of the re-polishing is performed with a polishing table different from the polishing table used in the step of the polishing.

6. The method according to claim 1, further comprising:

cleaning and drying the substrate in the cleaning and drying section when the measured thickness by the second sensor is within the predetermined second value.

7. The method according to claim 1, further comprising:

spraying a liquid onto a surface of a subsequent substrate when a step of polishing of the subsequent substrate is terminated and waiting for the subsequent step of the polishing due to delay caused by the re-polishing step or measuring the thickness of the film of the substrate.

8. The method according to claim 1, wherein the second sensor is an optical sensor.

9. The method according to claim 1, wherein the step of measuring the thickness of the polished film by the second sensor is performed such that the polished surface of the film on the substrate is immersed in water in a reservoir.

10. The method according to claim 1, wherein the step of measuring the thickness of the polished film by the second sensor is performed such that at least a part of the polishing liquid remained on the polished surface of the film measured is removed by water.

11. The method according to claim 1, further comprising:

calibrating the first sensor based on the measured values of the thickness of the film obtained from the first sensor and the second sensor;

polishing a subsequent substrate while measuring a thickness of a film of the subsequent substrate with the calibrated first sensor; and terminating the polishing of the subsequent substrate when the measured thickness of the film by the calibrated first sensor is within a predetermined first value.

12. The method according to claim 1, wherein the first sensor is an optical sensor or an eddy current sensor.

13. The method according to claim 1, wherein the step of the transporting the polished substrate is transporting the polished substrate with its surface being wet.

14. The method according to claim 1, wherein transporting the polished substrate to the measuring section is performed by the top ring.

15. The method according to claim 1, wherein transporting the polished substrate to the measuring section is performed by a transporting device after the polished substrate is transported from the top ring to the transporting device.

16. The method according to claim 1, wherein the second sensor comprises an optical-type film thickness measuring device configured to measure the thickness of the film in the presence of a liquid between the substrate and an optical film thickness measuring head.

17. The method according to claim 1, further comprising:

after comparing the thickness with the predetermined second value and before re-polishing the substrate, returning the substrate to one of polishing tables in the polishing section, the one of polishing tables being selected based on a film-thickness measurement result.

18. The method according to claim 1, wherein the predetermined first value is larger than the predetermined second value, and the predetermined first value is determined so that the film remaining on the substrate after polished is a film to be re-polished.

19. The method according to claim 1, further comprising:

before measuring the thickness of the polished film by the second sensor, detecting an orientation of the substrate in its circumferential direction.

20. The method according to claim 1, wherein the second sensor is a wet-type film thickness measuring device.

* * * * *